United States Patent
Seong

(10) Patent No.: US 10,991,437 B2
(45) Date of Patent: Apr. 27, 2021

(54) SEMICONDUCTOR MEMORY DEVICE, METHOD OF OPERATING THE SAME, AND MEMORY SYSTEM

(71) Applicant: SK hynix Inc., Icheon-si (KR)

(72) Inventor: Jin Yong Seong, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/749,826

(22) Filed: Jan. 22, 2020

(65) Prior Publication Data

US 2020/0388339 A1    Dec. 10, 2020

(30) Foreign Application Priority Data

Jun. 4, 2019 (KR) .................. 10-2019-0066220

(51) Int. Cl.
*G11C 16/30* (2006.01)
*G11C 16/04* (2006.01)

(52) U.S. Cl.
CPC .......... *G11C 16/30* (2013.01); *G11C 16/0483* (2013.01)

(58) Field of Classification Search
CPC .................... G11C 16/30; G11C 16/0483
See application file for complete search history.

(56) References Cited

U.S. PATENT DOCUMENTS

| 7,417,494 | B2 * | 8/2008 | Choi | G11C 5/147 327/541 |
| 2006/0233029 | A1 * | 10/2006 | Seitz | G11C 5/143 365/189.11 |
| 2014/0169064 | A1 * | 6/2014 | Choi | G11C 13/0038 365/148 |
| 2017/0294216 | A1 * | 10/2017 | Doo | G06F 1/3296 |

FOREIGN PATENT DOCUMENTS

| KR | 1020090107634 A | 10/2009 |
| KR | 1020140123829 A | 10/2014 |
| KR | 101737020 B1 | 5/2017 |
| KR | 1020170116553 A | 10/2017 |
| KR | 1020170124017 A | 11/2017 |

\* cited by examiner

*Primary Examiner* — Tri M Hoang
(74) *Attorney, Agent, or Firm* — William Park & Associates Ltd.

(57) ABSTRACT

A semiconductor device may include: an internal voltage supplier, and a voltage level controller. The internal voltage supplier may supply an internal power supply voltage to be used for the operation of the semiconductor device. The voltage level controller may determine whether a voltage level change condition of the semiconductor device is satisfied and controls the internal voltage supplier to change a voltage level of the internal power supply voltage based on a result of the determining.

13 Claims, 15 Drawing Sheets

FIG. 8
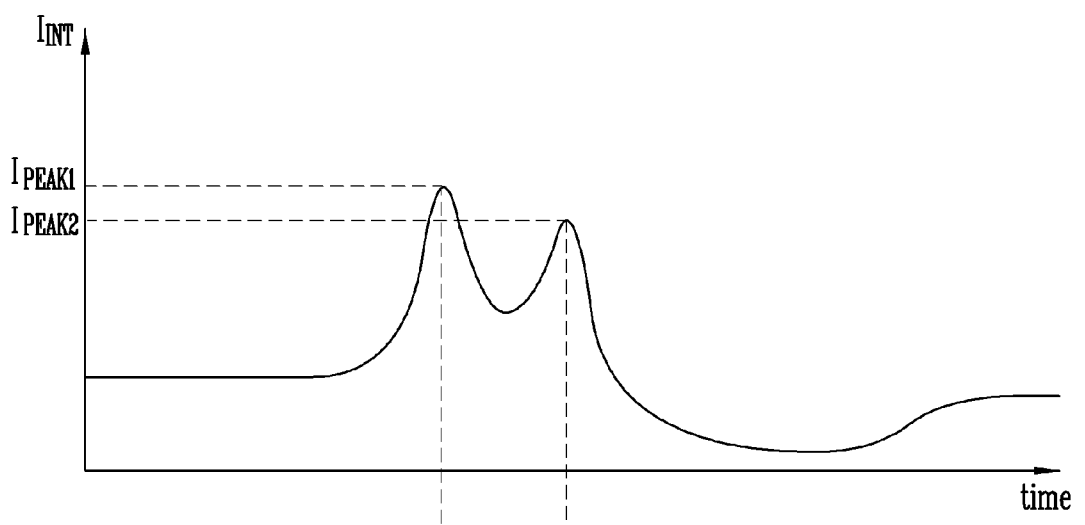
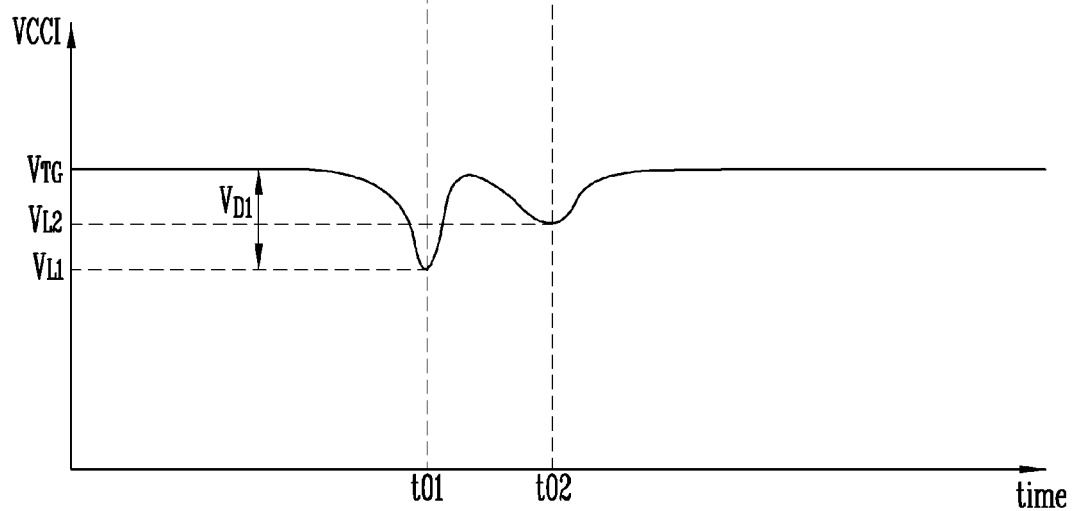

SEMICONDUCTOR MEMORY DEVICE, METHOD OF OPERATING THE SAME, AND MEMORY SYSTEM

CROSS-REFERENCE TO RELATED APPLICATION

The present application claims priority under 35 U.S.C. § 119(a) to Korean patent application number 10-2019-0066220 filed on Jun. 4, 2019, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device, a method of operating the same, and a memory system.

2. Related Art

Generally, a memory device may have a two-dimensional structure in which strings are horizontally arranged on a semiconductor substrate, or a three-dimensional structure in which strings are vertically stacked on a semiconductor substrate. The three-dimensional memory device may be a device which is devised to overcome a limitation in the degree of integration of the two-dimensional memory device and may include a plurality of memory cells which are vertically stacked on a semiconductor substrate.

SUMMARY

An embodiment of the present disclosure may provide for a semiconductor device including: an internal voltage supplier configured to supply an internal power supply voltage to be used for the operation of the semiconductor device; and a voltage level controller configured to control the internal voltage supplier. The voltage level controller may be configured to determine whether a voltage level change condition of the semiconductor device is satisfied and configured to control the internal voltage supplier to change a voltage level of the internal power supply voltage based on a result of the determining.

An embodiment of the present disclosure may provide for a memory system including: a semiconductor memory device; and a controller configured to control an operation of the semiconductor memory device. The controller may include a voltage control mode determiner configured to determine the voltage control mode and transmit a voltage control parameter to the semiconductor memory device. The semiconductor memory device may change a voltage level of an internal power supply voltage based on the voltage control parameter.

An embodiment of the present disclosure may provide for a method of operating a semiconductor memory device, including: receiving parameters for an operating state of the semiconductor memory device; determining whether a voltage level change condition is satisfied based on the parameters; and increasing a voltage level of an internal power supply voltage of the semiconductor memory device from a first level to a second level, based on a result of the determining.

BRIEF DESCRIPTION OF THE DRAWINGS

FIG. 8 is a graph, illustrating a drop of an internal power supply voltage when peak current flows.

DETAILED DESCRIPTION

Figure 1:
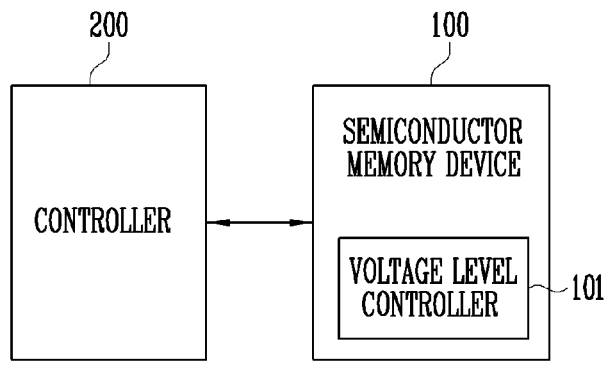
FIG. 1 is a block diagram, illustrating a memory system 1000, including a semiconductor memory device 100 and a controller 200.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or intervening elements may be present therebetween. In the specification, when an element is referred to as "comprising" or "including" a component, it does not preclude another component but may further include other components unless the context clearly indicates otherwise.

Hereinafter, embodiments of the present disclosure will be described in detail with reference to the accompanying drawings. Reference now should be made to the drawings, in which the same reference numerals are used throughout the different drawings to designate the same or similar components. Details of well-known configurations and functions may be omitted to avoid unnecessarily obscuring the gist of the present disclosure.

Various embodiments of the present disclosure are directed to a semiconductor memory device having improved operating reliability, and a memory system including the semiconductor memory device.

Various embodiments of the present disclosure are directed to a method of operating a semiconductor memory device having improved operating reliability.

FIG. 1 is a block diagram, illustrating a memory system 1000, including a semiconductor memory device 100 and a controller 200.

The semiconductor memory device 100 is operated under the control of the controller 200. The semiconductor memory device 100 includes a memory cell array including a plurality of memory blocks. In an embodiment, the semiconductor memory device 100 may be a flash memory device.

The semiconductor memory device 100 may receive a command and an address from the controller 200, through a channel CH, and access an area, selected by the address from the memory cell array. In other words, the semiconductor memory device 100 may perform an internal operation, corresponding to the command, on the area selected by the address.

For example, the semiconductor memory device 100 may perform a program operation, a read operation, and an erase operation. During a program operation, the semiconductor memory device 100 may program data to an area selected by an address. During a read operation, the semiconductor memory device 100 may read data from an area selected by an address. During an erase operation, the semiconductor memory device 100 may erase data stored in an area selected by an address.

The semiconductor memory device 100 may include a voltage level controller 101. The voltage level controller 101 may control the level of an internal power supply voltage, which is used to drive the semiconductor memory device 100.

The voltage level controller 101 of the semiconductor memory device 100, in accordance with an embodiment of the present disclosure, may control the level of the internal power supply voltage, which is supplied to internal circuits of the semiconductor memory device 100, under predetermined operating conditions. Therefore, in the case where peak current occurs, a drop of the internal power supply voltage may be compensated for.

The word "predetermined" as used herein with respect to a parameter, such as a predetermined operation conditions, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
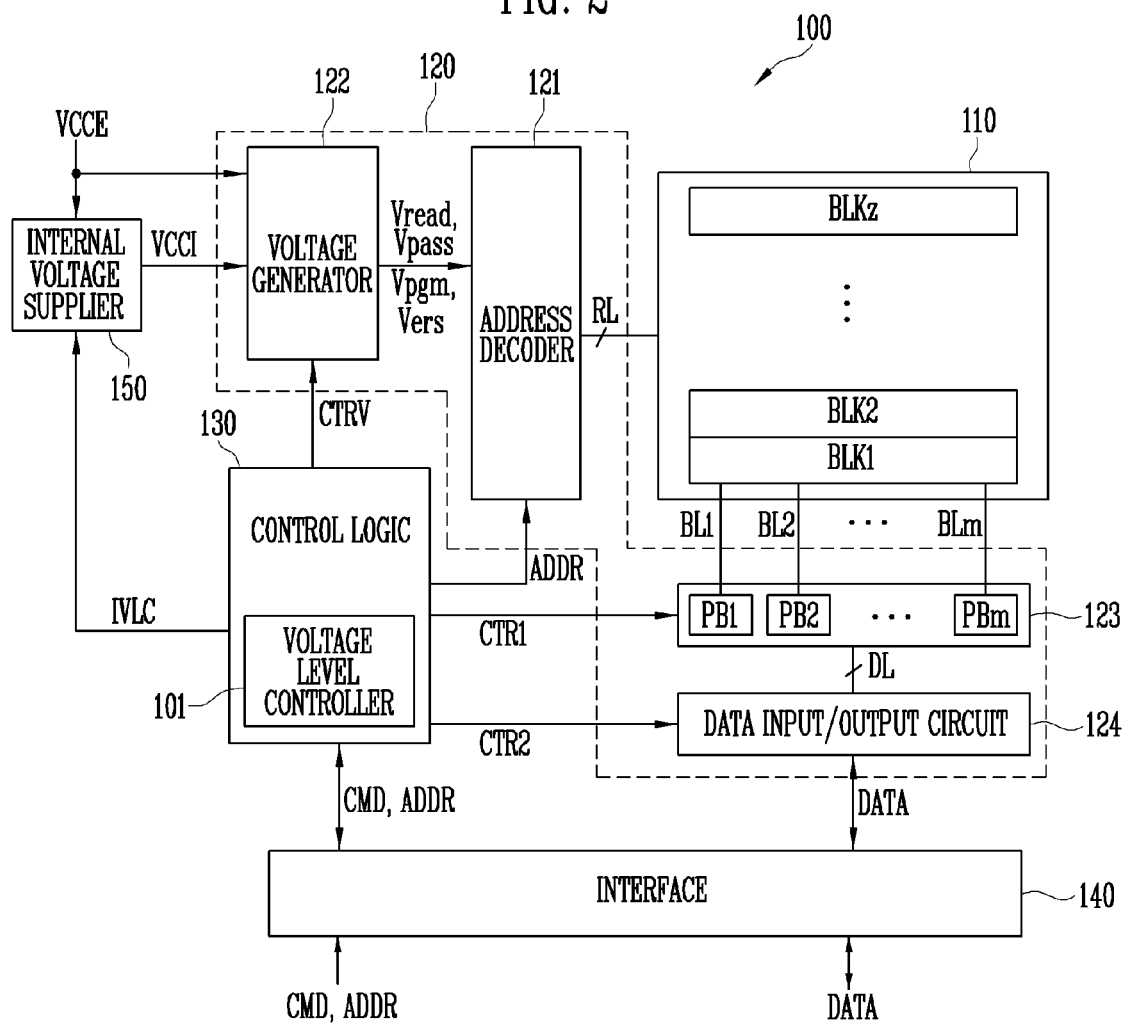
FIG. 2 is a block diagram, illustrating the configuration of the semiconductor memory device 100, of FIG. 1.

FIG. 2 is a block diagram, illustrating the configuration of the semiconductor memory device 100 of FIG. 1.

Referring to FIG. 2, the semiconductor memory device 100 may include a memory cell array 110, a peripheral circuit 120, a control logic 130, an interface 140, and an internal voltage supplier 150.

The memory cell array 110 is coupled to an address decoder 121 through row lines RL and coupled to a read/write circuit 123 through bit lines BL1 to BLm. The row lines RL may include a source selection line, a word line, and a drain selection line.

The memory cell array 110 may include a plurality of memory blocks BLK1 to BLKz. The plurality of memory blocks BLK1 to BLKz are coupled to the address decoder 121 through the row lines RL. The plurality of memory blocks BLK1 to BLKz are coupled to the read/write circuit 123 through the bit lines BL1 to BLm. Each of the memory blocks BLK1 to BLKz may include a plurality of memory cells. In an embodiment, the plurality of memory cells may be nonvolatile memory cells. Memory cells, coupled to the same word line, among the plurality of memory cells, are defined as one page. In other words, the memory cell array 110 may be formed of a plurality of pages.

Each of the memory cells of the semiconductor memory device 100 may be formed of a single level cell (SLC), capable of storing a single data bit, a multi-level cell (MLC), capable of storing two data bits, a triple-level cell (TLC), capable of storing three data bits, or a quad-level cell (QLC), capable of storing four data bits.

The peripheral circuit 120 may include the address decoder 121, a voltage generator 122, the read/write circuit 123, and a data input/output circuit 124.

The peripheral circuit 120 may drive the memory cell array 110. For example, the peripheral circuit 120 may drive the memory cell array 110 so as to perform a program operation, a read operation, or an erase operation.

The address decoder 121 is coupled to the memory cell array 100 through the row lines RL. The address decoder 121 may operate under the control of the control logic 130. Specifically, the address decoder 121 may receive addresses ADDR from the control logic 130.

The address decoder 121 may decode a block address among the received addresses ADDR. The address decoder 121 may select at least one of the memory blocks BLK1 to BLKz, based on the decoded block address. The address decoder 121 may decode a row address among the received addresses ADDR. The address decoder 121 may select at least one word line WL of the selected memory block by applying voltages supplied from the voltage generator 122 to at least one word line WL based on the decoded row address.

During a program operation, the address decoder 121 may apply a program voltage Vpgm to a selected word line and apply a pass voltage, having a level lower than that of the program voltage, to the unselected word lines. During a program verify operation, the address decoder 121 may apply a verify voltage to a selected word line and apply a verify pass voltage, higher than the verify voltage, to the unselected word lines.

During a read operation, the address decoder 121 may apply a read voltage Vread to a selected word line and apply a pass voltage Vpass, higher than the read voltage Vread, to the unselected word lines.

In an embodiment, the erase operation of the semiconductor memory device 100 may be performed in units of memory blocks. During an erase operation, an address ADDR includes a block address. The address decoder 121 may decode the block address and select a corresponding memory block based on the decoded block address. During an erase operation, the address decoder 121 may apply a ground voltage to a word line coupled to the selected memory block and apply an erase voltage Vers to a bulk area in which the selected memory block is formed.

In an embodiment, the address decoder 121 may decode a column address among the transmitted addresses ADDR. A decoded column address DCA may be transmitted to the read/write circuit 123. For example, the address decoder 121 may include components such as a row decoder, a column decoder, and an address buffer.

The internal voltage supplier 150 may generate an internal power supply voltage VCCI based on an external power supply voltage VCCE. In an embodiment, the internal voltage supplier 150 may generate an internal power supply voltage VCCI by regulating an external power supply voltage VCCE. The internal power supply voltage VCCI, generated from the internal voltage supplier 150, may be transmitted to the voltage generator 122. The voltage generator 122 may generate various voltages, based on the internal power supply voltage VCCI, needed to perform operations of the semiconductor memory device 100.

Specifically, the internal voltage supplier 150 may generate the internal power supply voltage VCCI from the external power supply voltage VCCE. During this process, the internal voltage supplier 150 may adjust the voltage level of the internal power supply voltage VCCI, based on an internal voltage control signal IVLC, received from the control logic 130.

The voltage generator 122 may generate a plurality of voltages, using the internal power supply voltage VCCI, supplied from the internal voltage supplier 150. The voltage generator 122 may operate in response to a control signal CTRV of the control logic 130.

In an embodiment, the voltage generator 122 may generate a plurality of voltages using the internal power supply voltage VCCI. The voltage generator 122 may generate various voltages required by the semiconductor memory device 100. For example, the voltage generator 122 may generate a program voltage Vpgm, a pass voltage Vpass, a read voltage Vread, and an erase voltage Vers.

For example, the voltage generator 122 may include a plurality of pumping capacitors to receive the internal supply voltage VCCI and generate a plurality of voltages by selectively activating the plurality of pumping capacitors in response to the control signal CTRV, received from the control logic 130. The generated voltages may be supplied to the memory cell array 110 by the address decoder 121.

In an embodiment, the voltage generator 122 may receive both the internal power supply voltage VCCI and the external power supply voltage VCCE. For example, the voltage generator 122 may generate at least one of a program voltage Vpgm, a pass voltage Vpass, a read voltage Vread, and an erase voltage Vers, based on the external power supply voltage VCCE.

The read/write circuit 123 may include first to m-th page buffers PB1 to PBm. The first to m-th page buffers PB1 to PBm are coupled to the memory cell array 110, through the first to m-th bit lines BL1 to BLm, respectively. The first to m-th page buffers PB1 to PBm are operated in response to a control signal CTR1, received from the control logic 130.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During the program operation, the first to m-th page buffers PB1 to PBm may transmit the data, received through the data input/output circuit 124, to selected memory cells, through the bit lines BL1 to BLm, when a program pulse is applied to a selected word line. The memory cells in the selected page are programmed based on the transmitted data DATA. A memory cell, coupled to a bit line to which a program enable voltage (e.g. a ground voltage) is applied, may have an increased threshold voltage. The threshold voltage of a memory cell, coupled to a bit line to which a program inhibit voltage (for example, a supply voltage) is applied, may be retained. During a program verify operation, the first to m-th page buffers PB1 to PBm may read the page data from selected memory cells through the bit lines BL1 to BLm.

During a read operation, the read/write circuit 123 may read data DATA, from the memory cells, in the selected page, through the bit lines BL, and output the read data DATA to the data input/output circuit 124.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm, through the data lines DL. The data input/output circuit 124 may operate in response to a control signal CTR2 received from the control logic 130. During a program operation, the data input/output circuit 124 may receive data DATA to be stored from an external controller (not illustrated). During a read operation, the data input/output circuit 124 may output data, transmitted from the first to m-th page buffers PB1 to PBm, included in the read/write circuit 123, to the external controller.

The control logic 130 may control the overall operation of the semiconductor memory device 100. The control logic 130 may operate in response to a command CMD, transmitted from an external device. The control logic 130 may be coupled to the address decoder 121, the voltage generator 122, the read/write circuit 123, and the data input/output circuit 124. The control logic 130 may control the operation of the internal voltage supplier 150. Specifically, the voltage level controller 101 of the control logic 130 may generate an internal voltage control signal IVLC to control the internal voltage supplier 150 to increase the internal power supply voltage VCCI when the amount of current, to be used in the semiconductor memory device 100, is expected to rapidly increase. The internal voltage supplier 150 may adjust the voltage level of the internal power supply voltage VCCI, based on an internal voltage control signal IVLC. Detailed configuration and operation of the voltage level controller 101 will be described later with reference to FIGS. 7 to 11.

The interface 140 may provide data communication between the semiconductor memory device 100 and the external device. The interface 140 may include a NAND interface or a NOR interface, based on the type of semiconductor memory device 100. Referring back to FIG. 1, in conjunction with FIG. 2, the semiconductor memory device 100 may exchange data with the controller 200 through the interface 140.

In the semiconductor memory device 100, in accordance with an embodiment of the present disclosure, the voltage level controller 101 may generate an internal voltage control signal IVLC to control the internal voltage supplier 150 to increase the internal power supply voltage VCCI when the amount of current, to be used in the semiconductor memory device 100, is expected to rapidly increase. Therefore, even when the amount of current is rapidly increased, a voltage drop width of the internal power supply voltage VCCI may be reduced. Therefore, the operating reliability of the semiconductor memory device 100 may be enhanced.

Figure 3:
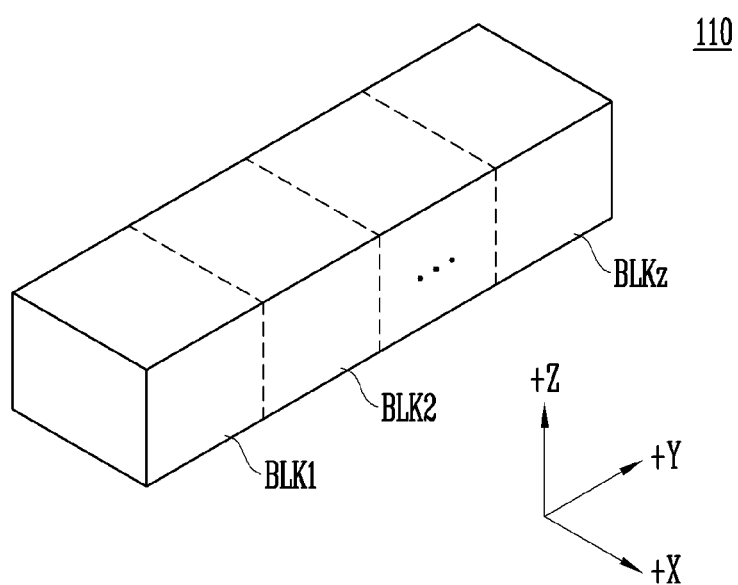
FIG. 3 is a diagram, illustrating an embodiment of a memory cell array, of FIG. 2.

FIG. 3 is a diagram, illustrating an embodiment of a memory cell array 110 of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
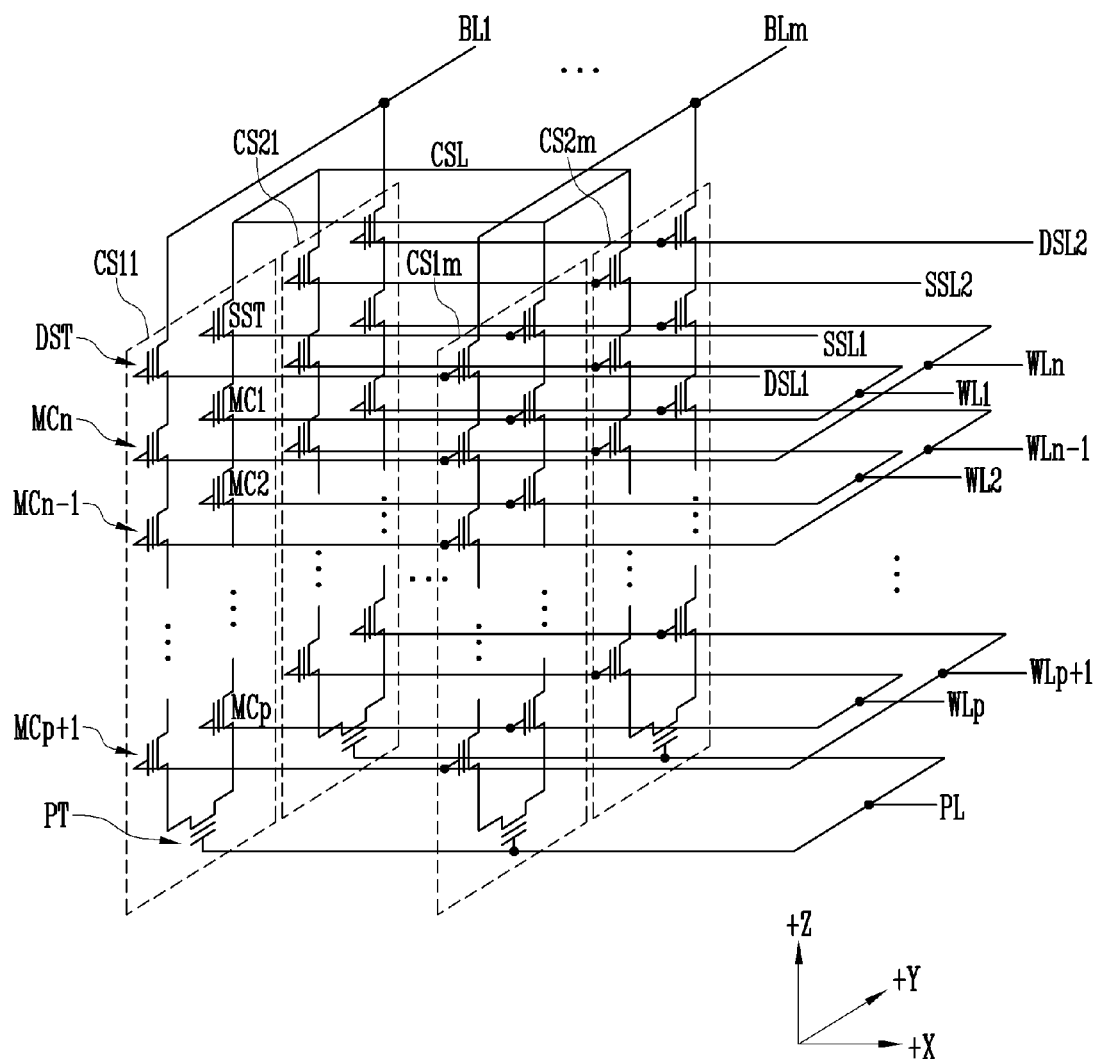
FIG. 4 is a circuit diagram, illustrating a memory block BLKa, representing one of the memory blocks BLK1 to BLKz of FIG. 2, in accordance with an embodiment of the present disclosure.

FIG. 4 is a circuit diagram, illustrating a memory block BLKa, representing one of the memory blocks BLK1 to BLKz of FIG. 2, in accordance with an embodiment of the present disclosure.

Referring to FIG. 4, the memory block BLKa may include a plurality of cell strings CS11 to CS1m and CS21 to CS2m. In an embodiment, each of the cell strings CS11 to CS1m and CS21 to CS2m may be formed in a 'U' shape on the Y-Z plane. In the memory block BLKa, m cell strings may be arranged in a row direction (i.e., the +X direction). In FIG. 4, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar may be provided in each cell string to form the channel layer. In an embodiment, a pillar may be provided in each cell string to form at least one of the channel layer, the tunneling insulating layer, the charge storage layer, and the blocking insulating layer.

The source select transistor SST of each cell string is coupled between the common source line CSL and the memory cells MC1 to MCp.

In an embodiment, source select transistors of cell strings, arranged in the same row, are coupled to a source select line, extending in a row direction, and source select transistors of cell strings, arranged in different rows, are coupled to different source select lines. In FIG. 4, source select transistors of the cell strings CS11 to CS1m, in a first row, are coupled to a first source select line SSL1. Source select transistors of the cell strings CS21 to CS2m, in a second row, are coupled to a second source select line SSL2.

In an embodiment, the source select transistors of the cell strings CS11 to CS1m and CS21 to CS2m may be coupled in common to a single source select line.

The first to n-th memory cells MC1 to MCn, in each cell string, are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled, in series, between the source select transistor SST and the pipe transistor PT. The p+1-th to n-th memory cells MCp+1 to MCn are successively arranged in the +Z direction and are coupled, in series, between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

The respective gates of the pipe transistors PT of the cell strings are coupled to a pipeline PL.

The drain select transistor DST of each cell string is coupled between the corresponding bit line and the memory cells MCp+1 to MCn. The cell strings, arranged in the row direction, are coupled to the drain select lines, extending in the row direction. Drain select transistors of the cell strings CS11 to CS1m, in the first row, are coupled to a first drain select line DSL1. Drain select transistors of the cell strings CS21 to CS2m, in the second row, are coupled to a second drain select line DSL2.

Cell strings, arranged in the column direction, may be coupled to bit lines, extending in the column direction. In FIG. 4, cell strings CS11 and CS21, in a first column, are coupled to a first bit line BL1. Cell strings CS1m and CS2m in an m-th column are coupled to an m-th bit line BLm.

Memory cells, coupled to the same word line, in cell strings arranged in the row direction, form a single page. For example, memory cells coupled to the first word line WL1, among the cell strings CS11 to CS1m, in the first row, form a single page. Memory cells coupled to the first word line WL1, among the cell strings CS21 to CS2m in the second row, form another single page. When any one of the drain select lines DSL1 and DSL2 is selected, the corresponding cell strings, arranged in the direction of a single row, may be selected. When any one of the word lines WL1 to WLn is selected, the corresponding single page may be selected from among the selected cell strings.

In an embodiment, even bit lines and odd bit lines may be provided in lieu of the first to m-th bit lines BL1 to BLm. The even-numbered cell strings of the cell strings CS11 to CS1m or CS21 to CS2m, arranged in the row direction, may be coupled to respective even bit lines. The odd-numbered cell strings of the cell strings CS11 to CS1m or CS21 to CS2m, arranged in the row direction, may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn. As the number of dummy memory cells increases, the operational reliability of the memory block BLKa may also increase. However, the size of the memory block BLKa may also increase. On the other hand, as the number of dummy memory cells decreases, the size of the memory block BLKa may also decrease. However the operational reliability of the memory block BLKa may also decrease.

To efficiently control the at least one dummy memory cells, each of the dummy memory cells may have a required threshold voltage. Before or after an erase operation of the memory block BLKa is performed, program operations may be performed on all or some of the dummy memory cells. In the case where an erase operation is performed after a program operation has been performed, the dummy memory cells may have required threshold voltages by controlling the voltages to be applied to the dummy word lines, coupled to the respective dummy memory cells.

Figure 5:
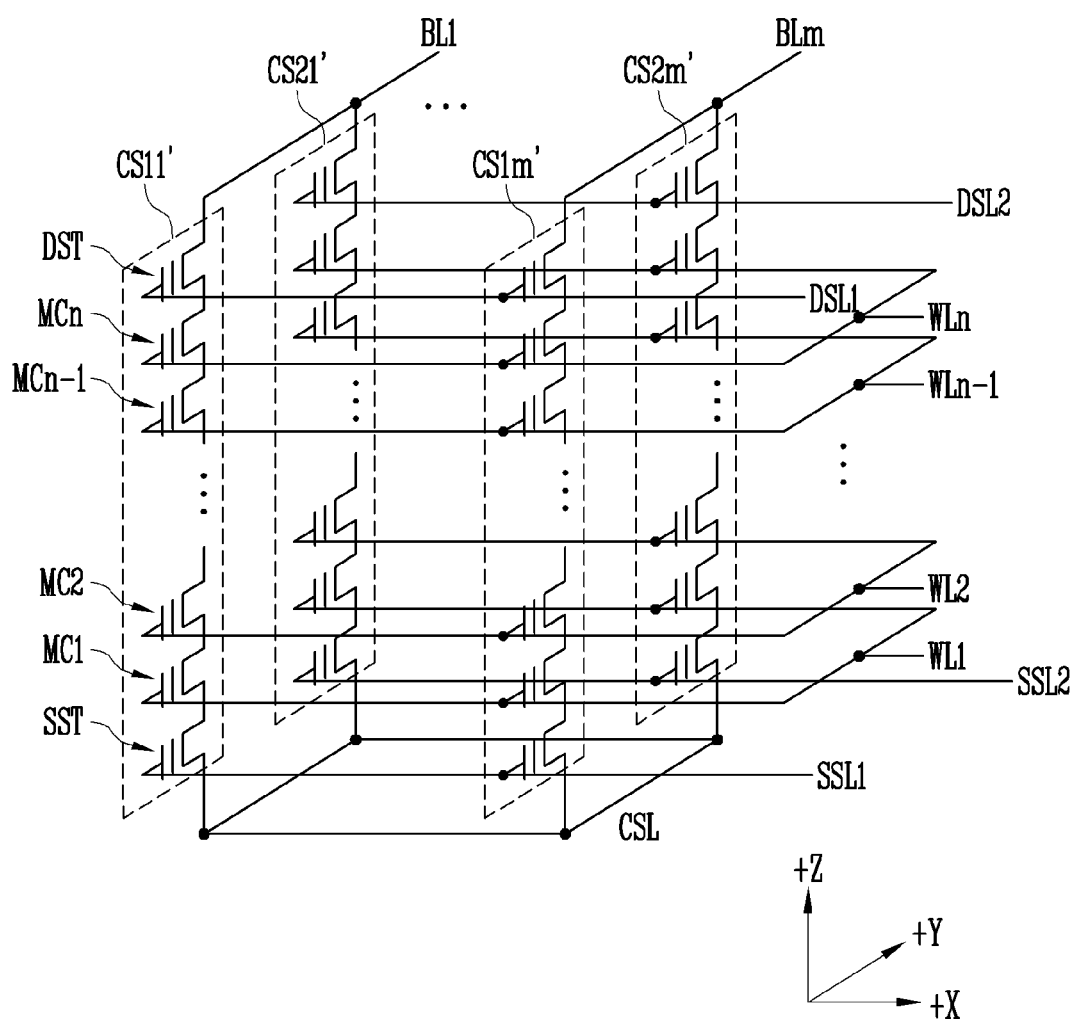
FIG. 5 is a circuit diagram, illustrating a memory block BLKb, representing one of the memory blocks BLK1 to BLKz of FIG. 3, in accordance with an embodiment of the present disclosure.

FIG. 5 is a circuit diagram, illustrating a memory block BLKb, representing one of the memory blocks BLK1 to BLKz of FIG. 3, in accordance with an embodiment of the present disclosure.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST, which are stacked on a substrate (not shown), provided in a lower portion of the memory block BLKb.

The source select transistor SST, of each cell string, is coupled between the common source line CSL and the memory cells MC1 to MCn. The source select transistors, arranged in the same row, are coupled to the same source select line. Source select transistors of the cell strings CS11' to CS1m', arranged in a first row, may be coupled to a first source select line SSL1. Source select transistors of the cell strings CS21' to CS2m', arranged in a second row, may be coupled to a second source select line SSL2. In an embodiment, source select transistors of the cell strings CS11' to CS1m' and CS21' to CS2m' may be coupled, in common, to a single source select line.

The first to n-th memory cells MC1 to MCn in each cell string are coupled, in series, between the source select transistor SST and the drain select transistor DST. The gates of the first to n-th memory cells MC1 to MCn are coupled to the first to n-th word lines WL1 to WLn, respectively.

The drain select transistor DST of each cell string is coupled between the corresponding bit line and the memory cells MC1 to MCn. Drain select transistors, arranged in the row direction, may be coupled to drain select lines, extending in the row direction. Drain select transistors of the cell strings CS11' to CS1m, in the first row, are coupled to a first drain select line DSL1. Drain select transistors of the cell strings CS21' to CS2m, in the second row, may be coupled to a second drain select line DSL2.

Consequently, the memory block BLKb of FIG. 5 may have an equivalent circuit, similar to that of the memory block BLKa of FIG. 4, except that a pipe transistor PT is excluded from each cell string.

In an embodiment, even bit lines and odd bit lines may be provided in lieu of the first to m-th bit lines BL1 to BLm. The even-numbered cell strings, among the cell strings CS11' to CS1m' or CS21' to CS2m, arranged in the row direction, may be coupled to the respective even bit lines, and the odd-numbered cell strings, among the cell strings CS11' to CS1m' or CS21' to CS2m, arranged in the row direction, may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells increases, the operational reliability of the memory block BLKb may also increase. However, the size of the memory block BLKb may also increase. On the other hand, as the number of dummy memory cells decreases, the size of the memory block BLKb may also decrease. However, the operational reliability of the memory block BLKb may also decrease.

To efficiently control the at least one dummy memory cells, each of the dummy memory cells may have a required threshold voltage. Before or after an erase operation of the memory block BLKb is performed, program operations may be performed on all or some of the dummy memory cells. In the case where an erase operation is performed after a program operation has been performed, the dummy memory cells may have required threshold voltages by controlling the voltages to be applied to the dummy word lines coupled to the respective dummy memory cells.

Figure 6:
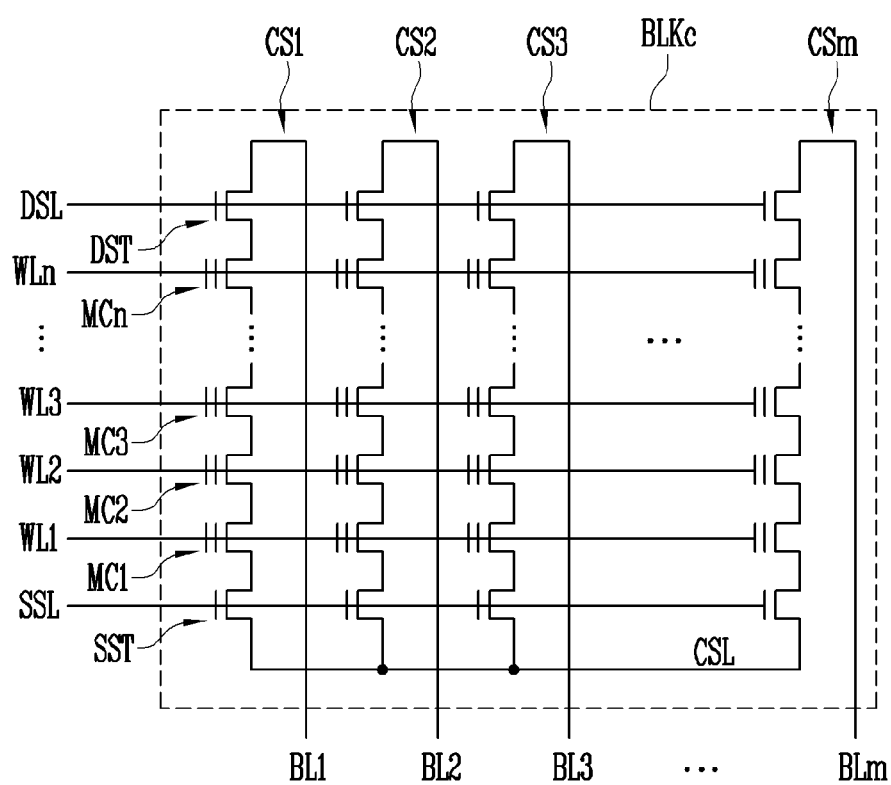
FIG. 6 is a circuit diagram, illustrating a memory block BLKc, representing one of the memory blocks BLK1 to BLKz included in the memory cell array 110 of FIG. 2, in accordance with an embodiment of the present disclosure.

FIG. 6 is a circuit diagram, illustrating a memory block BLKc, representing one of the memory blocks BLK1 to BLKz included in the memory cell array 110 of FIG. 2, in accordance with an embodiment of the present disclosure.

Referring to FIG. 6, the memory block BLKc includes a plurality of cell strings CS1 to CSm. The plurality of cell strings CS1 to CSm may be coupled to a plurality of bit lines BL1 to BLm, respectively. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar may be provided in each cell string to form the channel layer. In an embodiment, a pillar may be provided in each cell string to form at least one of the channel layer, the tunneling insulating layer, the charge storage layer, and the blocking insulating layer.

The source select transistor SST, of each cell string, is coupled between the common source line CSL and the memory cells MC1 to MCn.

The first to n-th memory cells MC1 to MCn, in each cell string, are coupled between the source select transistor SST and the drain select transistor DST.

The drain select transistor DST, of each cell string, is coupled between the corresponding bit line and the memory cells MC1 to MCn.

Memory cells, coupled to the same word line, may form a single page. The cell strings CS1 to CSm may be selected by selecting the drain select line DSL. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. The even-numbered cell strings of the cell strings CS1 to CSm may be coupled to respective even bit lines, and the odd-numbered cell strings may be coupled to respective odd bit lines.

As illustrated in FIGS. 3 to 5, the memory cell array 110 may be formed of a memory cell array having a three-dimensional structure. Alternatively, as illustrated in FIG. 6, the memory cell array 110 of the semiconductor memory device 100 may be formed of a memory cell array having a two-dimensional structure.

Figure 7:
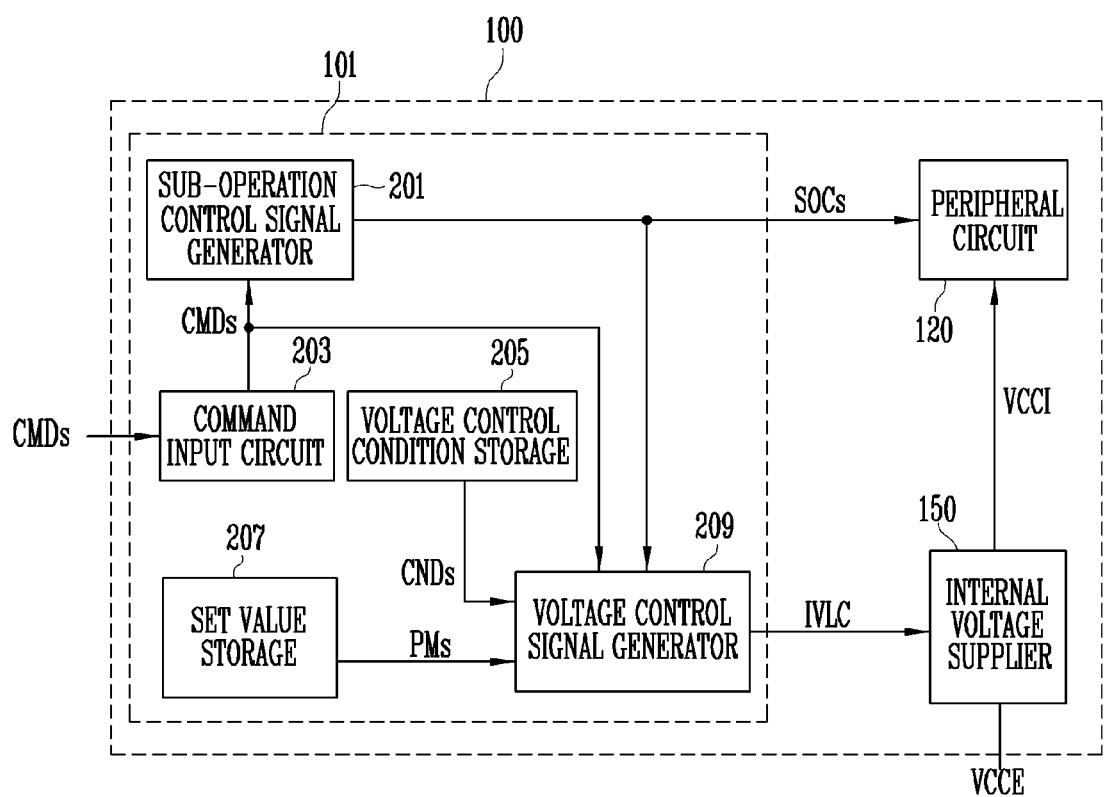
FIG. 7 is a block diagram, illustrating an embodiment of the semiconductor memory device 100, including a voltage level controller 101.

FIG. 7 is a block diagram, illustrating an embodiment of the semiconductor memory device 100, including the voltage level controller 101. Referring to FIG. 7, the semiconductor memory device 100 may include the voltage level controller 101, the peripheral circuit 120, and the internal voltage supplier 150. The semiconductor memory device of FIG. 7 may have substantially the same configuration as that of the semiconductor memory device of FIG. 2. Although not illustrated in FIG. 7, the voltage level controller 101 may be included in the control logic 130 of FIG. 2.

The voltage level controller 101 may include a sub-operation control signal generator 201, a command input circuit 203, a voltage control condition storage 205, a set value storage 207, and a voltage control signal generator 209.

The command input circuit 203 may receive commands CMDs from the controller 200. The commands CMDs may include a read command, a program command, an erase command, etc. The command input circuit 203 may transmit the received commands CMDs to the sub-operation control signal generator 201 and the voltage control signal generator 209.

The sub-operation control signal generator 201 may control the peripheral circuit 120 to perform a plurality of sub-operations, corresponding to the commands CMDs, received from the command input circuit 103. Specifically, an operation, corresponding to a specific command, may include a plurality of sub-operations. For example, a read operation, corresponding to a read command, may include sub-operations, such as a bit line precharge operation, a read voltage application operation, a read pass application operation, and a bit line sensing operation. In an embodiment, the sub-operation control signal generator 201 may generate a sub-operation control signal SOCs to control the peripheral circuit 120 to perform a bit line precharge operation. Thereafter, the sub-operation control signal generator 201 may generate a sub-operation control signal SOCs to control the peripheral circuit 120 to apply a read voltage to a word line coupled to a selected page. Furthermore, the sub-operation control signal generator 201 may generate a sub-operation control signal SOCs to control the peripheral circuit 120 to apply a read pass voltage to a word line coupled to an unselected page. Subsequently, the sub-operation control signal generator 201 may generate a sub-operation control signal SOCs to control the peripheral circuit 120 to perform a bit line sensing operation. The sub-operation control signals SOCs, generated from the sub-operation control signal generator 201, may be transmitted to the peripheral circuit 120. Furthermore, the sub-operation control signals SOCs may be transmitted to the voltage control signal generator 209.

The set value storage 207 may store set values (parameters: PMs), pertaining to a current operation of the semiconductor memory device 100. In an embodiment, the set value storage 207 may store, as the set values PMs, a voltage level of a read voltage Vread to be used during a read operation, a voltage level of a pass voltage Vpass, a voltage level of a program voltage Vpgm, a voltage level of an erase voltage Vers, etc. In an embodiment, the set value storage 207 may store a set value, pertaining to an operating speed of the interface 140, illustrated in FIG. 2. Based on the set values PMs stored in the set value storage 207, the interface 140 may perform a high-speed operation, a normal operation, or a low-speed operation.

The set values PMs, that are stored in the set value storage 207, may be determined or changed by a set parameter command received from the controller 200.

The voltage control condition storage 205 may store conditions CNDs for changing the internal power supply voltage VCCI. In an embodiment, with regard to a plurality of sub-operations included in a read operation, the condition in which a sub-operation control signal, to control a sub-operation which consumes a large amount of current, is received, may be stored as one of the conditions CNDs. For example, one of the conditions may be whether a sub-operation control signal, to control a bit line precharge operation, has been received. In this case, the foregoing condition may be transmitted to the voltage control signal generator 209. The voltage control signal generator 209, that has received the foregoing condition, may transmit an internal voltage control signal IVLC to increase the internal power supply voltage VCCI to the internal voltage supplier 150 when a sub-operation control signal SOCs, to control the bit line precharge operation, is received.

In an embodiment, when the peripheral circuit 120 performs a cache read operation, while the interface 140 of the semiconductor memory device 100 operates in a high-speed operating mode, a large amount of current is expected to be consumed. In such a case, the voltage control condition storage 205 may provide one of the following conditions CNDs to the voltage control signal generator 209, (i) when a set value PMs by which the interface 140 is operated in a high-speed operating mode is received from the set value storage 207 and (ii) when a cache read command instructing the peripheral circuit 120 to perform a cache read operation is received from the command input circuit 203. When one of the conditions is provided to the voltage control signal generator 209, the voltage control signal generator 209 may transmit an internal voltage control signal IVLC to increase the internal power supply voltage VCCI to the internal voltage supplier 150.

As such, a plurality of conditions, in which the voltage level of the internal power supply voltage VCCI is expected to decrease because the peripheral circuit 120 of the semiconductor memory device 100 consumes a large amount of current, may be stored in the voltage control condition storage 205. Here, whether a corresponding condition has been achieved may be determined by a combination of a command CMDs received from the command input circuit 203, a sub-operation control signal SOCs input from the sub-operation control signal generator 201, and set values PMs received from the set value storage 207. The voltage control signal generator 209 may receive conditions CNDs from the voltage control condition storage 205 and determine whether each condition CNDs has been achieved based on the received command CMDs, the sub-operation control signal SOCs, and the set values PMs. When any one of the received conditions CNDs is achieved and provided to the voltage control signal generator 209, the voltage control signal generator 209 may transmit an internal voltage control signal IVLC to increase the internal power supply voltage to the internal voltage supplier 150.

Here, the embodiment of FIG. 7 is only for illustrative purposes, and parameters other than the commands CMDs, the sub-operation signals SOCs, and the set values PMs may be used to determine whether the foregoing conditions have been achieved.

The internal voltage supplier 150 may receive an external power supply voltage VCCE and generate an internal power supply voltage VCCI. In this case, the internal voltage supplier 150 may increase the voltage level of the internal power supply voltage VCCI in response to an internal voltage control signal IVLC, received from the voltage control signal generator 209. A detailed method of adjusting the voltage level of the internal power supply voltage VCCI, by the internal voltage supplier 150, will be described later with reference to FIG. 11.

FIG. 8 is a graph, illustrating a drop of an internal power supply voltage when peak current flows.

Referring to FIG. 8, internal current $I_{INT}$, that flows out of an output terminal of the internal voltage supplier 150, and the internal power supply voltage VCCI, that is supplied to the output terminal of the internal voltage supplier 150, are illustrated in the graph as a function of time.

The voltage level of the internal power supply voltage VCCI may be set to a target level $V_{TG}$. Since the level of internal current $I_{INT}$ is relatively low before time t01, the voltage level of the internal power supply voltage VCCI may be maintained at the target level $V_{TG}$.

Thereafter, the level of the internal current $I_{INT}$ increases and reaches a first peak value $I_{PEAK1}$ at time t01. In this case, since the amount of current that flows out of the output terminal of the internal voltage supplier 150 is large, the voltage level of the internal power supply voltage VCCI may drop to a first level VL1. When the level of internal current $I_{INT}$ is reduced after time t01, the voltage level of the internal power supply voltage VCCI may increase to the target level $V_{TG}$. As illustrated in FIG. 8, the internal power supply voltage VCCI in FIG. 8 may drop by a first drop value $V_{D1}$ at time t01. Thereafter, the level of the internal current $I_{INT}$ increases again and reaches a second peak value $I_{PEAK2}$ at time t02. In this case, since the amount of current that flows out of the output terminal of the internal voltage supplier 150 is large, the voltage level of the internal power supply voltage VCCI may drop to a second level VL2.

As such, in the case where the voltage level of the internal power supply voltage VCCI is set to the fixed target level $V_{TG}$, the voltage level of the internal power supply voltage VCCI may undesirably drop when peak current flows. This may make the operation of the semiconductor memory device 100 unreliable.

Figure 9:
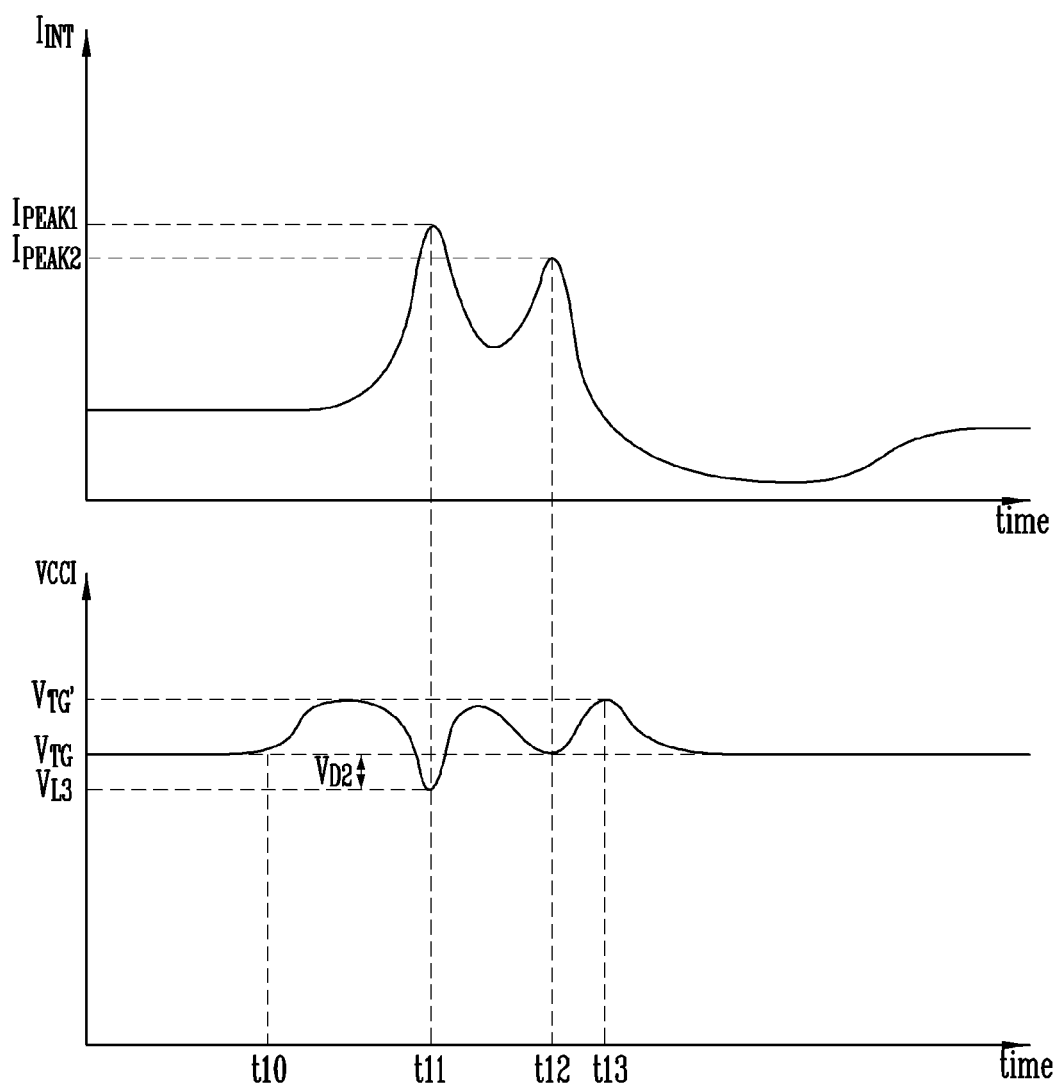
FIG. 9 is a graph, illustrating a voltage drop when the level of the internal power supply voltage is increased, in accordance with an embodiment of the present disclosure.

FIG. 9 is a graph, illustrating a voltage drop when the level of the internal power supply voltage is increased, in accordance with an embodiment of the present disclosure. Referring to FIG. 9, internal current $I_{INT}$, that flows out of the output terminal of the internal voltage supplier 150, and the internal power supply voltage VCCI, that is supplied to the output terminal of the internal voltage supplier 150, are illustrated in the graph as a function of time. Illustrated in FIG. 9, the graph of the internal current $I_{INT}$ as a function of time may be substantially the same as that of FIG. 8.

The voltage level of the internal power supply voltage VCCI may be set to a target level $V_{TG}$. At time t10, the voltage control signal generator 209 may determine that at least one of conditions CNDs, received from the voltage control condition storage 205, has been achieved, and may transmit an internal voltage control signal IVLC to increase the voltage level of the internal power supply voltage VCCI to the internal voltage supplier 150. Therefore, the internal voltage supplier 150 may increase the voltage level of the internal power supply voltage VCCI from the target level $V_{TG}$ to a temporary target level $V_{TG}'$.

Thereafter, the level of the internal current $I_{INT}$ increases and reaches a first peak value $I_{PEAK1}$ at time t11. In this case, the voltage level of the internal power supply voltage VCCI may drop from the temporary target level $V_{TG}'$ to a third level VL3. When the level of internal current $I_{INT}$ is reduced after time t11, the voltage level of the internal power supply voltage VCCI may increase to the temporary target level $V_{TG}'$. Thereafter, the level of the internal current $I_{INT}$ increases again and reaches a second peak value $I_{PEAK2}$ at time t12, and the voltage level of the internal power supply voltage VCCI may also drop. Subsequently, if the internal current $I_{INT}$ is expected to no longer increase at time t13 (in other words, if the voltage level change conditions are released), the voltage level of the internal power supply voltage VCCI may be reduced from the temporary target level $V_{TG}'$ back to the target level $V_{TG}$.

As illustrated in FIG. 9, the voltage level of the internal power supply voltage VCCI may drop to a third level VL3 at time t11. Therefore, the internal power supply voltage VCCI may drop from the target level $V_{TG}$ by a second drop value $V_{D2}$.

Referring to FIGS. 8 and 9, in the case of FIG. 8, when the peak current flows, the voltage level of the internal power supply voltage VCCI is reduced, from the target level $V_{TG}$, by the first drop value $V_{D1}$. In the case of FIG. 9, when the peak current flows, the voltage level of the internal power supply voltage VCCI is reduced, from the target level $V_{TG}$, by the second drop value $V_{D2}$. The second drop value $V_{D2}$ is a smaller value than the first drop value $V_{D1}$. Therefore, in the semiconductor memory device 100, in accordance with an embodiment of the present disclosure, the voltage level of the internal power supply voltage VCCI is increased, in advance, to prepare for the expected peak current, whereby the degree of the voltage drop from the target level $V_{TG}$ may be reduced when the peak current flows. Hence, even when the peak current flows, a voltage drop width of the internal power supply voltage VCCI may be reduced. Consequently, the operating reliability of the semiconductor memory device 10 may be enhanced.

Figure 10:
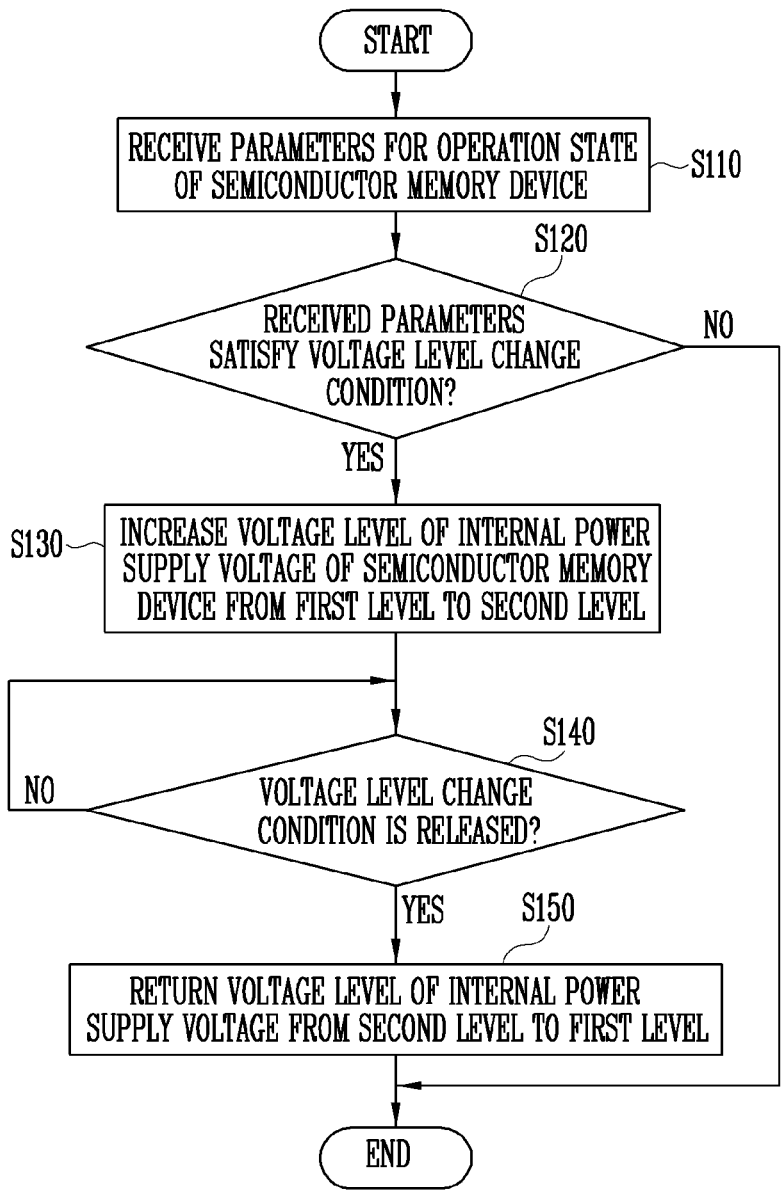
FIG. 10 is a flowchart, illustrating a method of operating the semiconductor memory device 100, in accordance with an embodiment of the present disclosure.

FIG. 10 is a flowchart, illustrating a method of operating the semiconductor memory device 100, in accordance with an embodiment of the present disclosure.

Referring to FIG. 10, the method of operating the semiconductor memory device 100, in accordance with an embodiment of the present disclosure, may include step S110 of receiving parameters for an operating state of the semiconductor memory device 100, step S120 of determining whether the received parameters satisfy the voltage level change conditions, and step S130 of increasing the internal voltage level of the semiconductor memory device 100 from a first level to a second level based on the received parameter. In an embodiment, the method of operating the semiconductor memory device 100 may further include step S140 of determining whether the voltage level change conditions have been released, and step S150 of returning the internal voltage level of the semiconductor memory device 100 from the second level to the first level.

At step S110, the voltage control signal generator 209, illustrated in FIG. 7, may receive parameters for the operating state of the semiconductor memory device 100. In an embodiment of FIG. 7, the parameters may include a sub-operation control signal SOCs, a command CMDs, a set value PMs, etc.

At step S120, the voltage control signal generator may determine whether the received parameters satisfy the voltage level change conditions. With reference to FIG. 7, the voltage level change conditions may be conditions CNDs, received from the voltage control condition storage 205.

Again, with reference to FIG. 7, if the voltage level change conditions are satisfied (YES at S120), the process proceeds to step S130. At step S130, the voltage level of the internal power supply voltage VCCI may be increased from the first level to the second level based on the received parameters. In this case, the voltage control signal generator 209 may generate an internal voltage control signal IVLC to control the voltage level of the internal power supply voltage VCCI and transmit the internal voltage control signal IVLC to the internal voltage supplier 150. The internal voltage supplier 150 may increase the voltage level of the internal power supply voltage VCCI from the first level to the second level in response to the internal voltage control signal IVLC. Referring to FIG. 9 in conjunction with FIG. 10, the first level may be the target level $V_{TG}$, while the second level may be the temporary target level $V_{TG}'$.

In the case where the voltage level change conditions are not satisfied (NO at step S120), the voltage level of the internal power supply voltage VCCI may be maintained.

In an embodiment, at step S140, it may be determined whether the voltage level change conditions have been released. Whether the voltage level change conditions have been released may be determined by checking whether an operation that generates a peak current has been completed. If it is determined that the voltage level change conditions have still not been released (NO at step S140), step S140 may be repeatedly performed.

In the case where it is determined that the voltage level change conditions have been released (YES at step S140), the voltage level of the internal power supply voltage may return from the second level to the first level. In this case, the voltage control signal generator 209 may generate an internal voltage control signal IVLC to control the voltage level of the internal power supply voltage VCCI and transmit the internal voltage control signal IVLC to the internal voltage supplier 150. The internal voltage supplier 150 may return the voltage level of the internal power supply voltage VCCI from the second level to the first level in response to the internal voltage control signal IVLC.

In the method of operating the semiconductor memory device 100, in accordance with an embodiment of the present disclosure, based on parameters for an operating state of the semiconductor memory device 100, the voltage level of an internal power supply voltage may be increased when the corresponding parameters satisfy voltage level change conditions. The voltage level change conditions may be conditions which correspond to the case where a peak current is expected to flow. In other words, it may correspond to the case where a drop of the internal power supply voltage is expected. Therefore, when a drop of the internal power supply voltage is expected to be caused by the peak current, the voltage level of the internal power supply voltage may be increased in advance. Consequently, the operating reliability of the semiconductor memory device may be enhanced.

Figure 11:
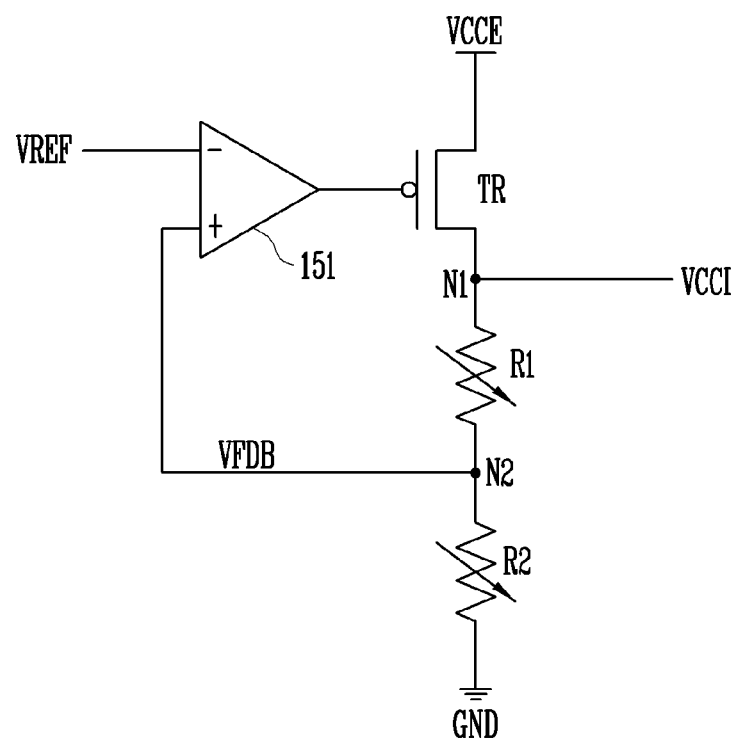
FIG. 11 is a circuit diagram, illustrating an exemplary embodiment of the internal voltage supplier 150.

FIG. 11 is a circuit diagram, illustrating an exemplary embodiment of the internal voltage supplier 150. Referring to FIG. 11, the internal voltage supplier 150 may be formed of a voltage regulator. The internal voltage supplier 150 may include a comparator 151, a PMOS transistor TR, a first resistor R1, and a second resistor R2. The comparator 151 may receive a reference voltage VREF, through an inverting input terminal (−), and receive a feedback voltage VFDB, through a non-inverting input terminal (+), and output a voltage, corresponding to a difference between the reference voltage VREF and the feedback voltage VFDB. The PMOS transistor TR is coupled between the external power supply voltage VCCE and an output node N1. The PMOS transistor TR may receive an output voltage from the comparator 151 as a gate voltage. The first and second resistors R1 and R2 are coupled between the output node N1 and a ground GND, and may function as a voltage divider. A voltage, divided on the feedback node N2, may be input to the comparator 151 as a feedback voltage VFDB by the first and second resistors R1 and R2. In an embodiment, each of the first and second resistors R1 and R2 may be formed of a variable resistor.

If the feedback voltage VFDB, input to the comparator 151, is less than the reference voltage VREF, the comparator 151 may output a low-level voltage. In this case, the low-level voltage output from the comparator 151 is applied to a gate of the PMOS transistor TR, so that the PMOS transistor TR is turned on. Thereby, the current flows from the external power supply voltage VCCE to the output node N1, and the voltage level of the internal power supply voltage VCCI, that is the voltage of the output node N1, is increased.

The feedback voltage VFDB, that is the voltage of the feedback node N2, is a voltage obtained by dividing the voltage of the output node N1. Hence, when the voltage of the output node N1 increases, the feedback voltage VFDB also increases. If the feedback voltage VFDB, to be input to the comparator, continuously increases and becomes higher than the reference voltage VREF, the comparator 151 may output a high-level voltage. In this case, the high-level voltage output from the comparator 151 is applied to the gate of the PMOS transistor TR, so that the PMOS transistor TR is turned off. Thereby, the external power supply voltage VCCE is electrically disconnected from the output node N1, and the voltage level of the internal power supply voltage VCCI that is the voltage of the output node N1 is maintained. In the case where internal current $I_{INT}$ flows out of the output node N1, the voltage level of the internal power supply voltage VCCI is lowered. In this case, the feedback voltage VFDB is also lowered, so that the comparator 151 may output a low-level voltage. Therefore, the PMOS transistor TR is turned on so that the voltage level of the internal power supply voltage VCCI may be increased again. While the foregoing process is repeatedly performed, the internal power supply voltage VCCI may be maintained at the preset target level $V_{TG}$.

Under normal conditions, in the case where the amount of current that flows out of the output node N1 is relatively small, even if the voltage level of the internal power supply voltage VCCI is reduced, the voltage output from the comparator 151 may turn on the PMOS transistor TR so that the internal power supply voltage VCCI may be rapidly recovered to the target level $V_{TG}$.

However, if a large amount of current flows out of the output node N1 while the peak current flows, the current that flows from the external power supply voltage VCCE to the output node N1 may be smaller than the current that flows out of the output node N1 even when the PMOS transistor TR is turned on. In this case, the internal power supply voltage VCCI, that is the voltage of the output node N1, is reduced by the peak current rather than being recovered to the target level $V_{TG}$. At time t01 or t02 illustrated in FIG. 8, the foregoing phenomenon may be caused.

In the semiconductor memory device 100, in accordance with an embodiment of the present disclosure, when the peak current is expected to flow, the voltage level of the internal power supply voltage VCCI may be increased based on an internal voltage control signal IVLC.

Specifically, the resistance value of the first resistor R1 may be increased by the internal voltage control signal IVLC. If the resistance value of the first resistor R1 is increased while the resistance value of the second resistor R2 remains constant, the voltage level of the feedback voltage VFDB is reduced. Therefore, as the voltage level of the feedback voltage VFDB is reduced while the reference voltage VREF remains constant, a voltage to be regulated on the output node N1 is increased. In other words, as shown at time t10 of FIG. 9, the voltage level of the internal power supply voltage VCCI may be increased from the target level $V_{TG}$ to a temporary target level $V_{TG}'$.

In an embodiment, the resistance value of the second resistor R2 may be reduced by the internal voltage control signal IVLC. If the resistance value of the second resistor R2 is reduced while the resistance value of the first resistor R1 remains constant, the voltage level of the feedback voltage VFDB is reduced. Therefore, as the voltage level of the feedback voltage VFDB is reduced while the reference voltage VREF remains constant, a voltage to be regulated on the output node N1 is increased. In other words, as shown at time t10 of FIG. 9, the voltage level of the internal power supply voltage VCCI may be increased from the target level $V_{TG}$ to a temporary target level $V_{TG}'$.

In an embodiment, the reference voltage VREF may be increased. As the reference voltage VREF is increased, while the resistance values of the first and second resistors R1 and R2 remain constant, the voltage to be regulated by the output node N1 is increased. In other words, as shown at time t10 of FIG. 9, the voltage level of the internal power supply voltage VCCI may be increased from the target level $V_{TG}$ to a temporary target level $V_{TG}'$.

As such, the voltage level of the internal power supply voltage VCCI to be output to the output node N1 may be changed by increasing the resistance value of the first resistor R1 by the internal voltage control signal IVLC, reducing the resistance value of the second resistor R2, or increasing the voltage level of the reference voltage VREF. At step S130 of FIG. 10, as described above, the voltage level of the internal power supply voltage VCCI may be increased from the first level to the second level.

In the semiconductor memory device 100 in accordance with an embodiment of the present disclosure, when the peak current is expected to no longer occur, the voltage level of the internal power supply voltage VCCI may return based on an internal voltage control signal IVLC.

Specifically, the voltage level of the internal power supply voltage VCCI that has been increased to the temporary target level $V_{TG}'$ may returned to the target level $V_{TG}$ by reducing the increased resistance value of the first resistor R1 to the original value, increasing the reduced resistance value of the second resistor R2 to the original value, or reducing the increased reference voltage VREF to the original value. At step S150 of FIG. 10, as described above, the voltage level of the internal power supply voltage VCCI may be increased from the second level to the first level.

FIG. 11 illustrates an embodiment in which the PMOS transistor TR is coupled to the output terminal of the comparator 151. In an embodiment, an NMOS transistor may be coupled to the output terminal of the comparator. In this case, the feedback voltage VFDB may be input to the inverting input terminal (−) of the comparator, and the reference voltage VREF may be applied to the non-inverting input terminal (+).

Figure 12:
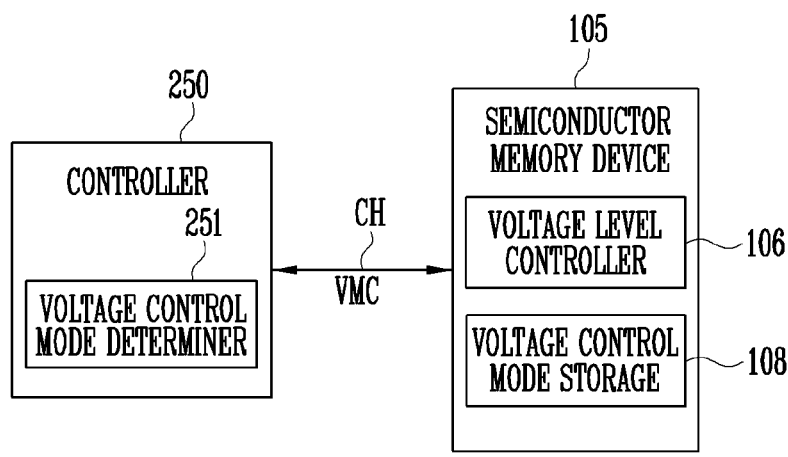
FIG. 12 is a block diagram, illustrating a memory system 1005, including a semiconductor memory device 105 and a controller 250, in accordance with an embodiment of the present disclosure.

FIG. 12 is a block diagram illustrating a memory system 1005 including a semiconductor memory device 105 and a controller 250 in accordance with an embodiment of the present disclosure.

The controller 250 includes a voltage control mode determiner 251. The voltage control mode determiner 252 may determine a voltage control mode of the semiconductor memory device 105. In an embodiment, the voltage control mode may be determined to be any one of a voltage change enable mode and a voltage change inhibit mode. The determined voltage control mode may be transmitted to the semiconductor memory device 105 as a voltage control parameter VMC.

The semiconductor memory device 105 includes a voltage level controller 106 and a voltage control mode storage 108. The voltage level controller 106 may control the level of an internal power supply voltage which is used to drive the semiconductor memory device 105. The voltage control mode storage 108 may store a voltage control mode. Specifically, the voltage control mode storage 108 may store the voltage control mode through the voltage control parameter VMC received from the controller 250.

In the case where the voltage control mode stored in the voltage control mode storage 108 is a voltage change enable mode, the voltage level controller 106 of the semiconductor memory device 105 may change the voltage level of the internal power supply voltage VCCI. In the voltage change enable mode, if parameters for the operating state of the semiconductor memory device 105 satisfy the voltage level change conditions, the voltage level controller 106 controls the internal voltage supplier 150 to increase the voltage level of the internal power supply voltage VCCI.

In the case where the voltage control mode stored in the voltage control mode storage 108 is a voltage change inhibit mode, the voltage level controller 106 of the semiconductor memory device 105 might not change the voltage level of the internal power supply voltage VCCI. In the voltage change inhibit mode, even if the parameters for the operating state of the semiconductor memory device 105 satisfy the voltage level change conditions, the voltage level controller 106 controls the internal voltage supplier 150 such that the voltage level of the internal power supply voltage VCCI is not increased.

In other words, in the memory system 1005 based on this embodiment, the controller 250 may determine the voltage control mode of the semiconductor memory device 105, and the determined voltage control mode may be transmitted to the semiconductor memory device 105. The semiconductor memory device 105 may increase or maintain the voltage level of the internal power supply voltage VCCI based on the received voltage control mode when the voltage level change conditions are satisfied.

Figure 13:
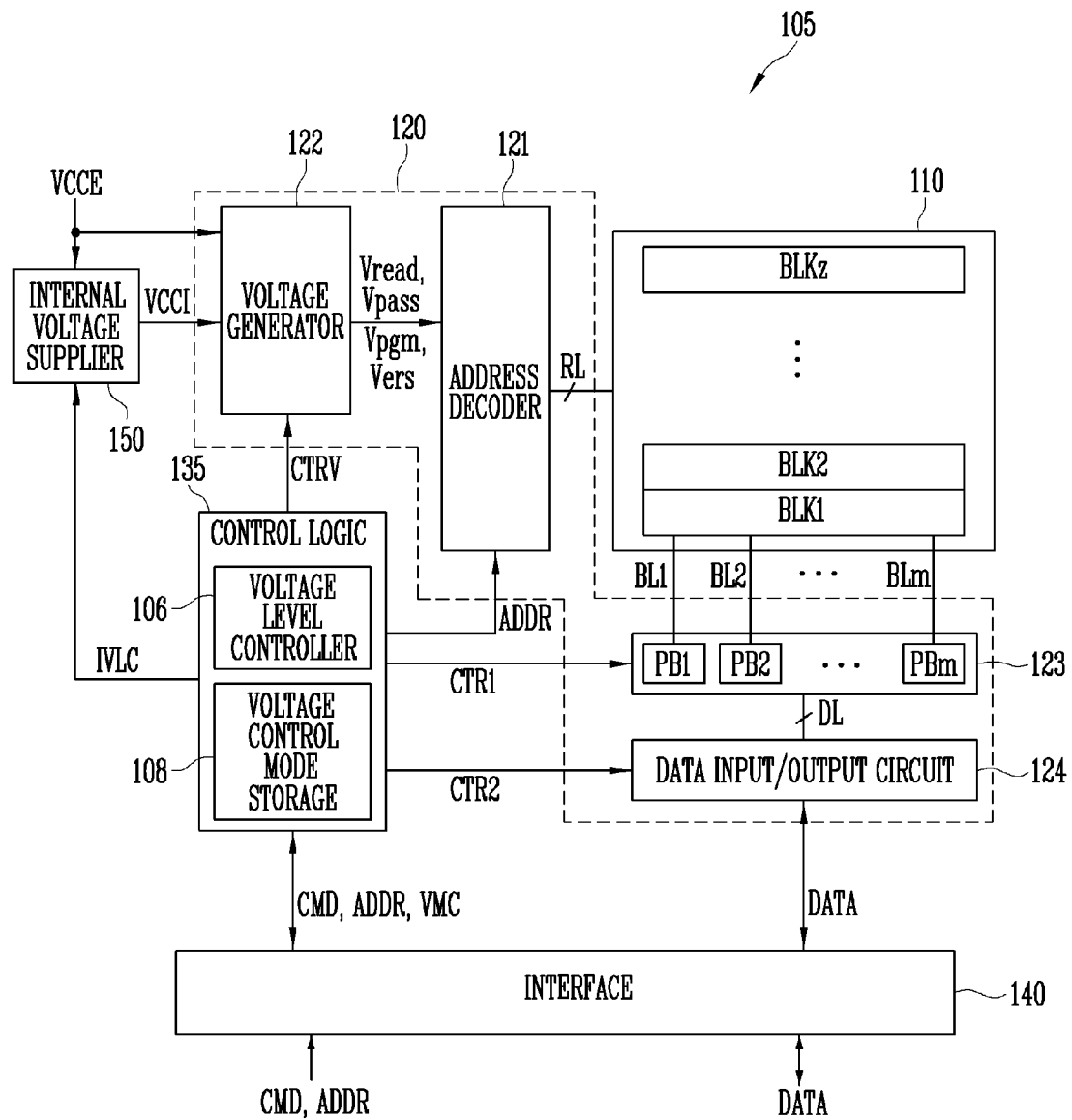
FIG. 13 is a block diagram, illustrating the configuration of the semiconductor memory device 105 of FIG. 12.

FIG. 13 is a block diagram illustrating the configuration of the semiconductor memory device 105 of FIG. 12.

Referring to FIG. 13, the semiconductor memory device 105 may include a memory cell array 110, a peripheral circuit 120, a control logic 135, an interface 140, and an internal voltage supplier 150. Components of the semiconductor memory device 105 other than the control logic 135 are substantially the same as those of the semiconductor memory device illustrated with reference to FIG. 2. Therefore, repetitive explanation of the other components except the control logic 135 will be omitted.

The control logic 135 may control the operation of the internal voltage supplier 150 and include a voltage level controller 106 and a voltage control mode storage 108.

The voltage control mode storage 108 may store a voltage control mode through voltage control parameters VMC received from the controller 250. Based on the voltage control mode stored in the voltage control mode storage 108, the semiconductor memory device 105 may be operated in any one of a voltage change enable mode and a voltage change inhibit mode.

In the case where the semiconductor memory device 105 is operated in the voltage change enable mode, the semiconductor memory device 105 may be operated in the same manner as that described with reference to FIGS. 7 to 11.

Specifically, the voltage level controller 106 of the control logic 135 may generate an internal voltage control signal IVLC to control the internal voltage supplier 150 to increase the internal power supply voltage VCCI when the amount of current to be used in the semiconductor memory device 105 is expected to rapidly increase. The internal voltage supplier 150 may adjust the voltage level of the internal power supply voltage VCCI based on an internal voltage control signal IVLC.

In the case where the semiconductor memory device 105 is operated in the voltage change inhibit mode, the voltage level controller 101 and the internal voltage supplier 150 might not adjust the voltage level of the internal power supply voltage VCCI.

Figure 14:
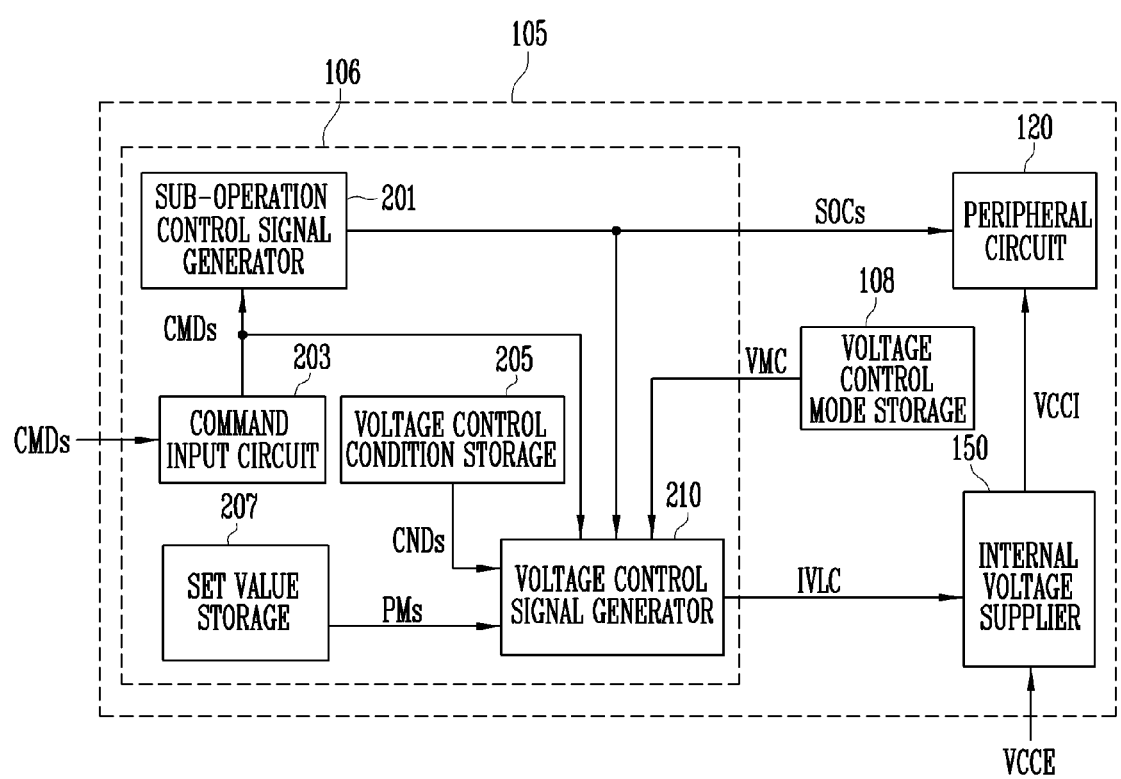
FIG. 14 is a block diagram, illustrating an embodiment of the semiconductor memory device 105, including the voltage level controller 106 and the voltage control mode storage 108.

FIG. 14 is a block diagram illustrating an embodiment of the semiconductor memory device 105 including the voltage level controller 106 and the voltage control mode storage 108. Referring to FIG. 14, the semiconductor memory device 105 may include the voltage level controller 106, the voltage control mode storage 108, the peripheral circuit 120, and the internal voltage supplier 150. A sub-operation control signal generator 201, a command input circuit 203, a voltage control condition storage 205, and a set value storage 207 of FIG. 14 may be operated in substantially the same manner as that of the components illustrated in FIG. 7. Therefore, repetitive explanation of the corresponding components will be omitted.

The voltage control signal generator 210 may receive not only a sub-operation control signal SOCs, a command CMDs, a voltage control condition CNDs, and a set value PMs, but also a voltage control parameter VMC. The voltage control parameter VMC may be usually stored in the voltage control mode storage 108. Based on the voltage control parameter VMC, the voltage control mode of the semiconductor memory device 105 may be determined. In other words, based on a detailed value of the voltage control parameter VMC, the semiconductor memory device 105 may be operated in any one of the voltage change enable mode and the voltage change inhibit mode.

In the case where the value indicated by the voltage control parameter VMC corresponds to the voltage change enable mode, the voltage control signal generator 210 may be operated in substantially the same manner as that of the voltage control signal generator 209 illustrated in FIG. 7. Specifically, in the case where the voltage control parameter VMC received from the voltage control mode storage 108 corresponds to the voltage change enable mode, the voltage control signal generator 210 may generate an internal voltage control signal IVLC instructing the internal voltage supplier 150 to increase the voltage level of the internal power supply voltage VCCI when at least one of the conditions CNDs received from the voltage control condition storage 205 is satisfied.

In the case where the value indicated by the voltage control parameter VMC corresponds to the voltage change inhibit mode, the voltage level of the internal power supply voltage VCCI that is output from the internal voltage supplier 150 might not be increased. Specifically, in the case where the voltage control parameter VMC received from the voltage control mode storage 108 corresponds to the voltage change inhibit mode, the voltage control signal generator 210 might not generate an internal voltage control signal IVLC instructing the internal voltage supplier 150 to increase the voltage level of the internal power supply voltage VCCI even when at least one of the conditions CNDs received from the voltage control condition storage 205 is satisfied.

As such, in the case where the voltage control mode set by the controller 250 is "voltage change enable mode", the voltage level of the internal power supply voltage VCCI may be increased in advance when the voltage level of the internal power supply voltage VCCI is expected to be reduced because the peripheral circuit 120 of the semiconductor memory device 100 consumes a large amount of current. In other words, as shown in FIG. 9, at time t10, the voltage level of the internal power supply voltage VCCI may be increased from the target level $V_{TG}$ to a temporary target level $V_{TG}'$.

In the case where the voltage control mode set by the controller 250 is "voltage change inhibit mode", the voltage level of the internal power supply voltage VCCI might not be increased in advance even when the voltage level of the internal power supply voltage VCCI is expected to be reduced.

As described above, in the memory system 1005 based on an embodiment of the present disclosure, the controller 250 may determine whether to increase the voltage level of the internal power supply voltage VCCI of the semiconductor memory device 105 based on conditions.

Figure 15:
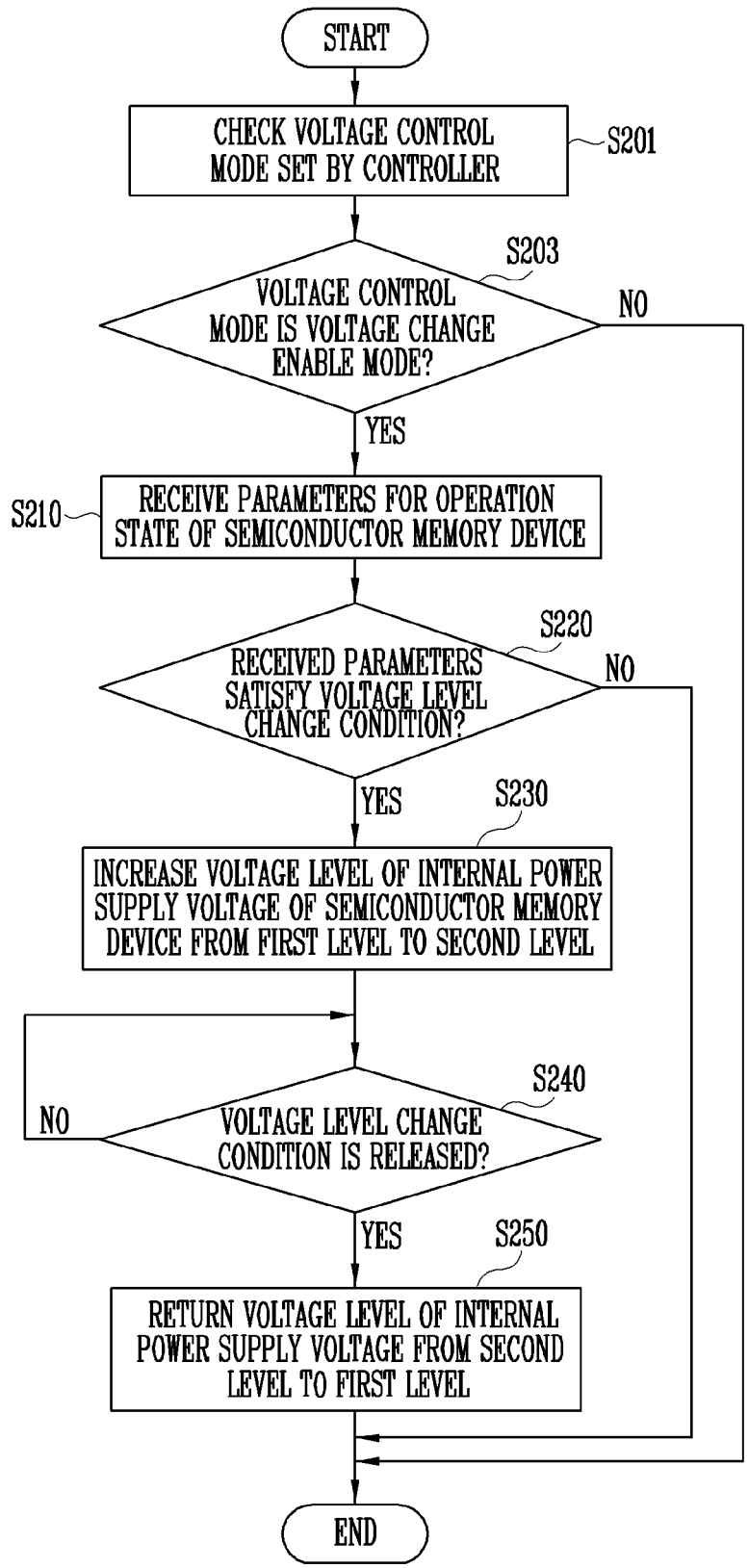
FIG. 15 is a flowchart, illustrating a method of operating the semiconductor memory device 105, in accordance with an embodiment of the present disclosure.

FIG. 15 is a flowchart illustrating a method of operating the semiconductor memory device 105 in accordance with an embodiment of the present disclosure.

Referring to FIG. 15, the method of operating the semiconductor memory device 105 in accordance with an embodiment of the present disclosure may include step S201 of checking a voltage control mode set by the controller, step S203 of determining whether the voltage control mode is a voltage change enable mode, step S210 of receiving parameters for the operating state of the semiconductor memory device 105, step S220 of determining whether the received parameters satisfy the voltage level change conditions, and step S230 of increasing the internal voltage level of the semiconductor memory device from a first level to a second level based on the received parameters. In an embodiment, the method of operating the semiconductor memory device 105 may further include step S240 of determining whether the voltage level change conditions have been released, and step S250 of returning the internal voltage level of the semiconductor memory device 100 from the second level to the first level.

At step S201, the voltage control signal generator 210 may receive a voltage parameter VMC received from the voltage control mode storage 108 and check a voltage control mode set by the controller. In other words, based on a value indicated by the voltage control parameter VMC, it may be determined whether the current voltage control mode of the semiconductor memory device 105 is the voltage change enable mode or the voltage change inhibit mode.

If a result of the determination at step S203 indicates that the received voltage control parameter VMC corresponds to the voltage change inhibit mode (NO at step S203), steps S203, S210, S220, S230, S240, and S250 might not be performed. Therefore, even when the voltage level change conditions are satisfied, the voltage level of the internal power supply voltage VCCI might not be changed.

If the result of the determination at step S203 indicates that the received voltage control parameter VMC corresponds to the voltage change enable mode (YES at step S203), the process proceeds to step S210.

At step S210, the voltage control signal generator 210 illustrated in FIG. 14 may receive parameters for the operating state of the semiconductor memory device 100. In an embodiment of FIG. 14, the parameters may include a sub-operation control signal SOCs, a command CMDs, a set value PMs, etc.

At step S220, the voltage control signal generator may determine whether the received parameters satisfy the voltage level change conditions. In an embodiment of FIG. 14, the voltage level change conditions may be conditions CNDs received from the voltage control condition storage 205.

If the voltage level change conditions are satisfied (YES at S220), the process proceeds to step S230. At step S230, the voltage level of the internal power supply voltage VCCI of the semiconductor device 100 may be increased from the first level to the second level based on the received parameter. In this case, the voltage control signal generator 209 may generate an internal voltage control signal IVLC to control the voltage level of the internal power supply voltage VCCI and transmit the internal voltage control signal IVLC to the internal voltage supplier 150. The internal voltage supplier 150 may increase the voltage level of the internal power supply voltage VCCI from the first level to the second level in response to the internal voltage control signal IVLC. Referring to FIG. 10 together, the first level may be the target level $V_{TG}$. The second level may be the temporary target level $V_{TG}'$.

In the case where the voltage level change conditions are not satisfied (NO at step S220), the voltage level of the internal power supply voltage VCCI might not be changed.

In an embodiment, at step S240, it may be determined whether the voltage level change conditions have been released. Whether the voltage level change conditions have been released may be determined by checking whether an operation of generating peak current has been completed. If it is determined that the voltage level change conditions have still not been released (NO at step S240), step S240 may be repeatedly performed.

In the case where it is determined that the voltage level change conditions have been released (YES at step S240), the voltage level of the internal power supply voltage may return from the second level to the first level. In this case, the voltage control signal generator 210 may generate an internal voltage control signal IVLC to control the voltage level of the internal power supply voltage VCCI and transmit the internal voltage control signal IVLC to the internal voltage supplier 150. The internal voltage supplier 150 may return the voltage level of the internal power supply voltage VCCI from the second level to the first level in response to the internal voltage control signal IVLC.

In the method of operating the semiconductor memory device 105 in accordance with an embodiment of the present disclosure, it may be determined whether to change the voltage level of the internal power supply voltage VCCI based on the voltage control mode set under control of the controller 250. In the voltage change enable mode, the voltage level of the internal power supply voltage is increased when the parameters for the operating state of the semiconductor memory device satisfy the voltage level change conditions. The voltage level change conditions may be conditions corresponding to the case where peak current is expected to flow, in other words, the case where a drop of the internal power supply voltage is expected to be caused. Therefore, when a drop of the internal power supply voltage is expected to be caused by the peak current, the voltage level of the internal power supply voltage may be increased in advance. Consequently, the operating reliability of the semiconductor memory device may be enhanced.

In the voltage change inhibit mode, the voltage level of the internal power supply voltage is not increased even when the parameters for the operating state of the semiconductor memory device satisfy the voltage level change conditions. In this case, the voltage level of the internal power supply voltage VCCI may be reduced when peak current flows. However, since the voltage level of the internal power supply voltage VCCI does not exceed the target level $V_{TG}$, the power consumption may be reduced.

Figure 16:
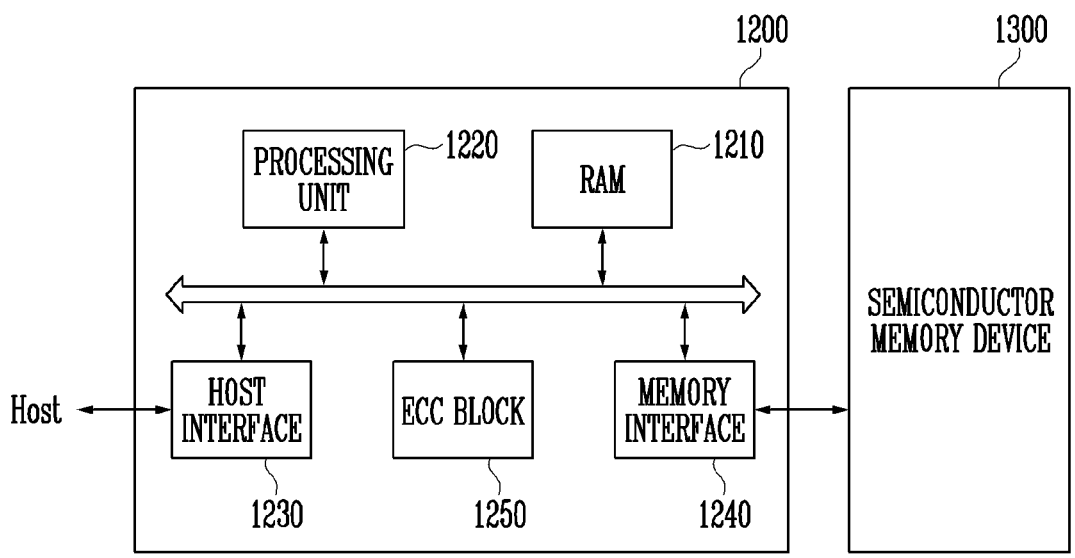
FIG. 16 is a block diagram, illustrating a memory system 1000, including the semiconductor memory device and the controller that are illustrated in FIG. 1.

FIG. 16 is a block diagram illustrating a memory system 1000 including the semiconductor memory device and the controller that are illustrated in FIG. 1. Referring FIG. 16, the memory system 1000 may include a semiconductor memory device 1300 and a controller 1200.

The semiconductor memory device 1300 may have the same configuration and operation as those of the semiconductor memory device described with reference to FIG. 2. Hereinafter, repetitive explanations will be omitted.

The controller 1200 is coupled to a host Host and the semiconductor memory device 1300. The controller 1200 may access the semiconductor memory device 1300 in response to a request from the host Host. For example, the controller 1200 may control read, write, remove, and background operations of the semiconductor memory device 1300. The controller 1200 may provide an interface between the semiconductor memory device 1300 and the host. The controller 1200 may drive firmware to control the semiconductor memory device 1300.

The controller 1200 may include a random access memory (RAM) 1210, a processing unit 1220, a host interface 1230, a memory interface 1240, and an error correction block 1250.

The RAM 1210 is used as at least one of an operating memory for the processing unit 1220, cache memory between the semiconductor memory device 1300 and the host, and buffer memory between the semiconductor memory device 1300 and the host.

The processing unit 1220 may control the overall operation of the controller 1200. The processing unit 1220 may control read, program, erase, and background operations of the semiconductor memory device 1000. The processing unit 1220 may drive firmware to control the semiconductor memory device 1000. The processing unit 1220 may perform a function of a flash translation layer (FTL). The processing unit 1220 may translate a logical block address (LBA), provided by the host, into a physical block address (PBA) through the FTL. The FTL may receive the LBA and translate the LBA into the PBA using a mapping table. An address mapping method using the FTL may be modified in various ways based on the unit of mapping. Representative address mapping methods may include a page mapping method, a block mapping method, and a hybrid mapping method.

The host interface 1230 may include a protocol for performing data exchange between the host and the controller 1200. In an embodiment, the controller 1200 may be configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 may interface with the semiconductor memory device 1300. For example, the memory interface 1240 includes a NAND interface or a NOR interface.

The error correction block 1250 may use an error correcting code (ECC) to detect and correct an error in data received from the semiconductor memory device 1300. The error correction block 1250 may correct errors from read page data using an ECC. The error correction block 1250 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or hamming code.

During a read operation, the error correction block 1250 may correct errors from read page data. When a number of error bits exceeding the number of correctable bits are included in the read page data, decoding may fail. When a number of error bits less than or equal to the number of correctable bits are included in the page data, decoding may succeed. A success in decoding indicates that the corresponding read command has passed. A failure in decoding indicates that the corresponding read command has failed. When decoding succeeds, the controller 1200 may output error-corrected page data to the host.

The controller 1200 and the semiconductor memory device 1300 may be integrated into a single semiconductor device. In an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCM-CIA), a compact flash card (CF), a smart media card (SMC), a memory stick multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD may include a storage device configured to store data in a semiconductor memory. When the memory system is used as the SSD, an operation speed of the host Host coupled to the memory system 2000 may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices to form a home network, one of various electronic devices to form a computer network, one of various electronic devices to form a telematics network, an RFID device, one of various elements to form a computing system, or the like.

In an embodiment, the semiconductor memory device 1300 or the memory system 1000 may be embedded in various types of packages. For example, the semiconductor memory device 1300 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

In FIG. 16, there is illustrated the memory system including the semiconductor memory device and the controller of FIG. 1. In some embodiments, the memory system may include a semiconductor memory device 105 and a controller 250 of FIG. 12. In this case, the voltage control mode determiner 201 of the controller 250 may determine whether to change the voltage level of the internal power supply voltage VCCI of the semiconductor memory device 105.

Figure 17:
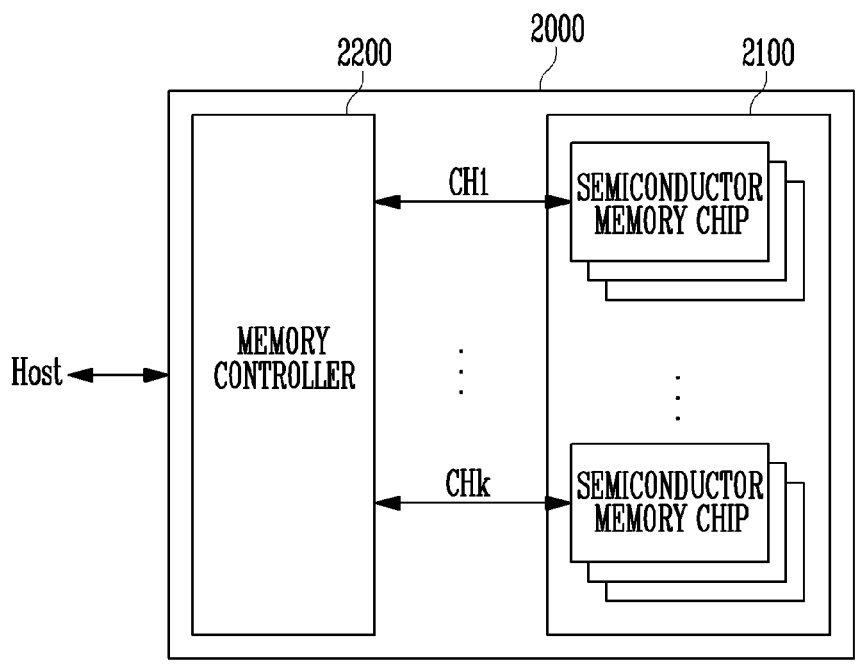
FIG. 17 is a block diagram, illustrating an application example 2000 of the memory system of FIG. 16.

FIG. 17 is a block diagram illustrating an application example 2000 of the memory system of FIG. 16.

Referring FIG. 17, a memory system 2000 may include a semiconductor memory device 2100 and a controller 2200. The semiconductor memory device 2100 includes a plurality of memory chips. The semiconductor memory chips may be divided into a plurality of groups.

In FIG. 17, it is illustrated that the plurality of groups respectively communicate with the controller 2200 through first to k-th channels CH1 to CHk. Each semiconductor memory chip may have the same configuration and operation as those of a component of the semiconductor memory device 1000 described with reference to FIG. 16.

Each group may communicate with the controller 2200 through one common channel. The controller 2200 has the same configuration as that of the controller 1200 described with reference to FIG. 16 and may control a plurality of memory chips of the semiconductor memory device 2100 through the plurality of channels CH1 to CHk.

In FIG. 17, a plurality of semiconductor memory chips has been illustrated as being coupled to each channel. However, it will be understood that the memory system 2000 may be modified into a configuration such that a single memory chip is coupled to each channel.

Figure 18:
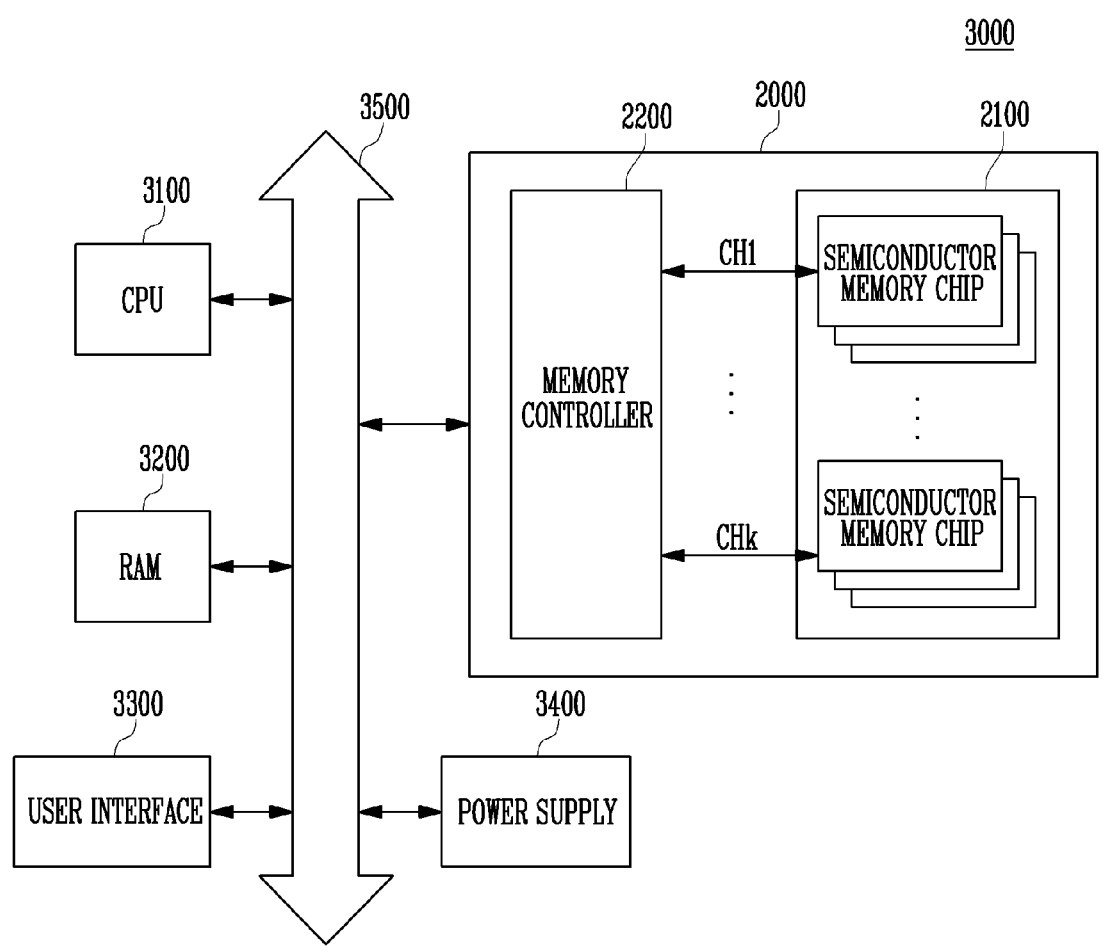
FIG. 18 is a block diagram, illustrating a computing system including the memory system, illustrated with reference to FIG. 17.

FIG. 18 is a block diagram illustrating a computing system including the memory system illustrated with reference to FIG. 17.

Referring to FIG. 18, the computing system 3000 may include a central processing unit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 18, the semiconductor memory device 2100 has been illustrated as being coupled to the system bus 3500 through the controller 2200. Furthermore, the semiconductor memory device 2100 may be directly coupled to the system bus 3500. The function of the controller 2200 may be performed by the CPU 3100 and the RAM 3200.

In FIG. 18, it is illustrated that the memory system 2000 described with reference to FIG. 17 is provided. In an embodiment, the memory system 2000 may be replaced with the memory system 1000 described with reference to FIG. 16. In an embodiment, the computing system 3000 may include both the memory systems 1000 and 2000 described with reference to FIGS. 16 and 17.

Various embodiments of the present disclosure may provide a semiconductor memory device having improved operating reliability, and a memory system including the semiconductor memory device.

Various embodiments of the present disclosure may provide a method of operating a semiconductor memory device having improved operating reliability.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment might not be always performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present invention have been described with reference to the accompanying drawings, and specific terms or words used in the description should be construed in accordance with the spirit of the present invention without limiting the subject matter thereof. It should be understood that many variations and modifications of the basic inventive concept described herein will still fall within the spirit and scope of the present disclosure as defined in the appended claims and their equivalents.

What is claimed is:

1. A semiconductor device comprising:
   an internal voltage supplier configured to supply an internal power supply voltage to be used for an operation of the semiconductor device;
   a voltage level controller configured to control the internal voltage supplier;
   a memory cell array including a plurality of memory cells; and
   a peripheral circuit configured to perform an operation for the memory cell array,
   wherein the voltage level controller is configured to determine whether a voltage level change condition of the semiconductor device is satisfied and configured to control the internal voltage supplier to change a voltage level of the internal power supply voltage based on a result of the determining, and
   wherein the voltage level controller comprises:
   a command input circuit configured to receive a command to control the operation of the semiconductor device;
   a sub-operation control signal generator configured to generate a plurality of sub-operation control signals to control the peripheral circuit to perform a plurality of sub-operations corresponding to the command;
   a set value storage configured to store a plurality of set values to be used for the operation of the semiconductor device;
   a voltage control condition storage configured to store at least one condition, the at least one condition with ability to change the voltage level of the internal power supply voltage; and
   a voltage control signal generator configured to determine whether the at least one condition is satisfied based on the plurality of sub-operation control signals, the plurality of set values, and the command.

2. The semiconductor device according to claim 1, wherein the voltage level change condition is satisfied when the voltage level of the internal power supply voltage is expected to decrease.

3. The semiconductor device according to claim 1, wherein, when the voltage level change condition is satisfied, the voltage level controller controls the internal voltage supplier to increase the voltage level of the internal power supply voltage from a first level to a second level.

4. The semiconductor device according to claim 3, wherein, when the voltage level change condition is released, the voltage level controller controls the internal voltage supplier to reduce the voltage level of the internal power supply voltage from the second level to the first level.

5. The semiconductor device according to claim 1, wherein, when the at least one condition is satisfied, the voltage control signal generator generates an internal voltage control signal to control the internal voltage supplier to increase the voltage level of the internal power supply voltage to a second level.

6. The semiconductor device according to claim 1, wherein, when the at least one condition is released, the voltage control signal generator generates an internal voltage control signal to control the internal voltage supplier to reduce the voltage level of the internal power supply voltage to a first level.

7. The semiconductor device according to claim 1, wherein the internal voltage supplier comprises:
   a transistor coupled between an external power supply voltage and an output node;
   a voltage divider coupled between the output node and a ground node and configured to output a divided voltage; and
   a comparator configured to compare a reference voltage and the divided voltage of the voltage divider and transmit an output voltage to a gate of the transistor.

8. The semiconductor device according to claim 7,
   wherein the transistor is formed of a PMOS transistor,
   wherein the reference voltage is input to an inverting input terminal of the comparator, and
   wherein the divided voltage is input to a non-inverting input terminal of the comparator.

9. The semiconductor device according to claim 7,
   wherein the transistor is formed of an NMOS transistor,
   wherein the reference voltage is input to a non-inverting input terminal of the comparator, and
   wherein the divided voltage is input to an inverting input terminal of the comparator.

10. The semiconductor device according to claim 7, wherein the voltage divider comprises:
    a first resistor coupled between the output node and a distribution node; and
    a second resistor coupled between the distribution node and the ground node.

11. The semiconductor device according to claim 10,
    wherein the first resistor is formed of a variable resistor, and
    wherein the voltage control signal generator increases the voltage level of the internal power supply voltage by increasing a resistance value of the first resistor, and reduces the voltage level of the internal power supply voltage by reducing the resistance value of the first resistor.

12. The semiconductor device according to claim 10,
wherein the second resistor is formed of a variable resistor, and
wherein the voltage control signal generator increases the voltage level of the internal power supply voltage by reducing a resistance value of the second resistor, and reduces the voltage level of the internal power supply voltage by increasing the resistance value of the second resistor.

13. The semiconductor device according to claim 7, wherein the voltage control signal generator increases the voltage level of the internal power supply voltage by increasing the reference voltage, and reduces the voltage level of the internal power supply voltage by reducing the reference voltage.

* * * * *